US012740360B2

(12) United States Patent
Pan

(10) Patent No.: US 12,740,360 B2
(45) Date of Patent: Sep. 15, 2026

(54) METHOD FOR FABRICATING A SEMICONDUCTOR DEVICE AND FOR A REWORKING PROCESS USING A FAILED HARD MASK LAYER

(71) Applicant: NANYA TECHNOLOGY CORPORATION, New Taipei City (TW)

(72) Inventor: Wei-Chen Pan, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 158 days.

(21) Appl. No.: 18/886,016

(22) Filed: Sep. 16, 2024

(65) Prior Publication Data

US 2025/0014910 A1 Jan. 9, 2025

Related U.S. Application Data

(62) Division of application No. 17/709,821, filed on Mar. 31, 2022, now Pat. No. 12,293,922.

(51) Int. Cl.

*H10P 50/00* (2026.01)
*H10W 20/00* (2026.01)
*H10W 20/42* (2026.01)

(52) U.S. Cl.

CPC ........... *H10P 50/73* (2026.01); *H10W 20/056* (2026.01); *H10W 20/074* (2026.01); *H10W 20/089* (2026.01); *H10W 20/42* (2026.01)

(58) Field of Classification Search

CPC .... H10P 50/73; H10P 70/234; H10W 20/056; H10W 20/074; H10W 20/089;

(Continued)

(56) References Cited

U.S. PATENT DOCUMENTS 8,084,862 B2 * 12/2011 Lin ........................ H10P 14/60 257/734
2005/0272237 A1 * 12/2005 Hautala ................ H10P 50/283 438/795

(Continued)

OTHER PUBLICATIONS

Office Action and and the search report mailed on Jan. 14, 2025 related to U.S. Appl. No. 17/709,821, wherein this application is a DIV of U.S. Appl. No. 17/709,821.

(Continued)

*Primary Examiner* — Wael M Fahmy
*Assistant Examiner* — Tiberiu Dan Onuta
(74) *Attorney, Agent, or Firm* — Xuan Zhang

(57) ABSTRACT

The present application discloses a method for fabricating a semiconductor device including providing a substrate; forming a dielectric layer on the substrate; forming a via opening in the dielectric layer using a first mask layer as a mask; forming a failed hard mask layer to fill the via opening; forming a second mask layer on the failed hard mask layer; removing the second mask layer and the failed hard mask layer; forming an underfill layer to fill the via opening; forming a top hard mask layer on the underfill layer; forming a third mask layer on the top hard mask layer; patterning the top hard mask layer using the third mask layer as a mask; forming a trench opening in the dielectric layer using the top hard mask layer as a mask; and forming a via in the via opening and forming a trench in the trench opening.

16 Claims, 24 Drawing Sheets

(58) Field of Classification Search
CPC . H10W 20/42; H10W 20/081; H10W 20/085; H10W 20/086
See application file for complete search history.

(56) References Cited

U.S. PATENT DOCUMENTS

| | | | | |
|---|---|---|---|---|
| 2010/0190347 | A1* | 7/2010 | RamachandraRao | H10P 50/667 510/176 |
| 2020/0328289 | A1* | 10/2020 | Cheng | H10D 30/024 |
| 2021/0287940 | A1* | 9/2021 | Mignot | H10W 20/063 |
| 2023/0197448 | A1* | 6/2023 | Zhang | G03F 7/20 438/689 |
| 2023/0317512 | A1* | 10/2023 | Pan | H10P 50/73 438/666 |

OTHER PUBLICATIONS

Office Action and and the search report mailed on Sep. 10, 2024 related to U.S. Appl. No. 17/709,821, wherein this application is a DIV of U.S. Appl. No. 17/709,821.
Office Action and and the search report mailed on Oct. 10, 2024 related to U.S. Appl. No. 17/709,569.

* cited by examiner

METHOD FOR FABRICATING A SEMICONDUCTOR DEVICE AND FOR A REWORKING PROCESS USING A FAILED HARD MASK LAYER

CROSS-REFERENCE TO RELATED APPLICATION

This application is a divisional application of U.S. Non-Provisional application Ser. No. 17/709,821 filed Mar. 31, 2022, which is incorporated herein by reference in its entirety.

TECHNICAL FIELD

The present disclosure relates to a method for fabricating a semiconductor device and a reworking process related to the fabrication of the semiconductor device.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for fabricating a semiconductor device including providing a substrate; forming a dielectric layer on the substrate; forming a via opening in the dielectric layer using a first mask layer as a mask; forming a failed hard mask layer to fill the via opening; forming a second mask layer on the failed hard mask layer; removing the second mask layer and the failed hard mask layer; forming an underfill layer to fill the via opening; forming a top hard mask layer on the underfill layer; forming a third mask layer on the top hard mask layer; patterning the top hard mask layer using the third mask layer as a mask; forming a trench opening in the dielectric layer using the top hard mask layer as a mask; and forming a via in the via opening and forming a trench in the trench opening.

Another aspect of the present disclosure provides a method for fabricating a semiconductor device including providing a substrate; forming a dielectric layer on the substrate; forming a via opening in the dielectric layer using a first mask layer as a mask; forming a failed hard mask layer to fill the via opening; forming a second mask layer on the failed hard mask layer; removing the second mask layer; performing a reapplying process to turn the failed hard mask layer into a bottom filling layer; forming a top hard mask layer on the bottom filling layer; forming a third mask layer on the top hard mask layer; patterning the top hard mask layer using the third mask layer as a mask; forming a trench opening in the dielectric layer using the top hard mask layer as a mask; and forming a via in the via opening and forming a trench in the trench opening.

Another aspect of the present disclosure provides a reworking method of a failed hard mask layer on a via opening in a dielectric layer, including removing the failed hard mask layer; forming an underfill layer to fill the via opening; forming a top hard mask layer on the underfill layer; and forming a mask layer on the top hard mask layer.

Another aspect of the present disclosure provides a reworking method of a failed hard mask layer on a via opening in a dielectric layer, including performing a reapplying process to turn the failed hard mask layer into a bottom filling layer; forming a top hard mask layer on the bottom filling layer; and forming a mask layer on the top hard mask layer.

Due to the design of the method of fabricating the semiconductor device of the present disclosure, the enlargement of the via opening and/or the damage to the profile of the via opening may be alleviated or avoided by employing the underfill layer or the bottom filling layer. As a result, the yield and/or the reliability of the semiconductor devices may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
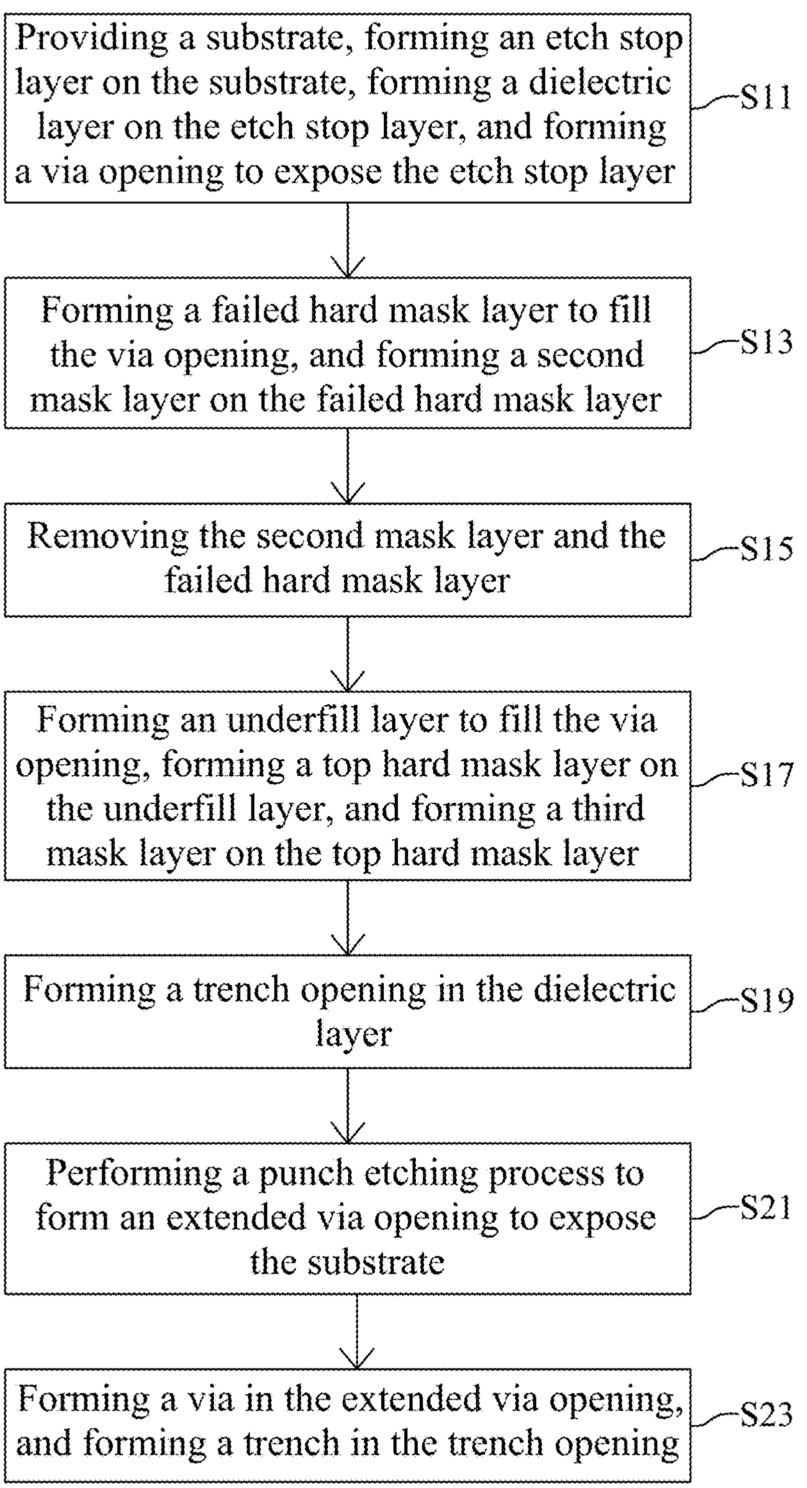
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 12 illustrate, in schematic cross-sectional view diagrams, a flow for fabricating the semiconductor device 1A in accordance with one embodiment of the present disclosure.

Figure 2:
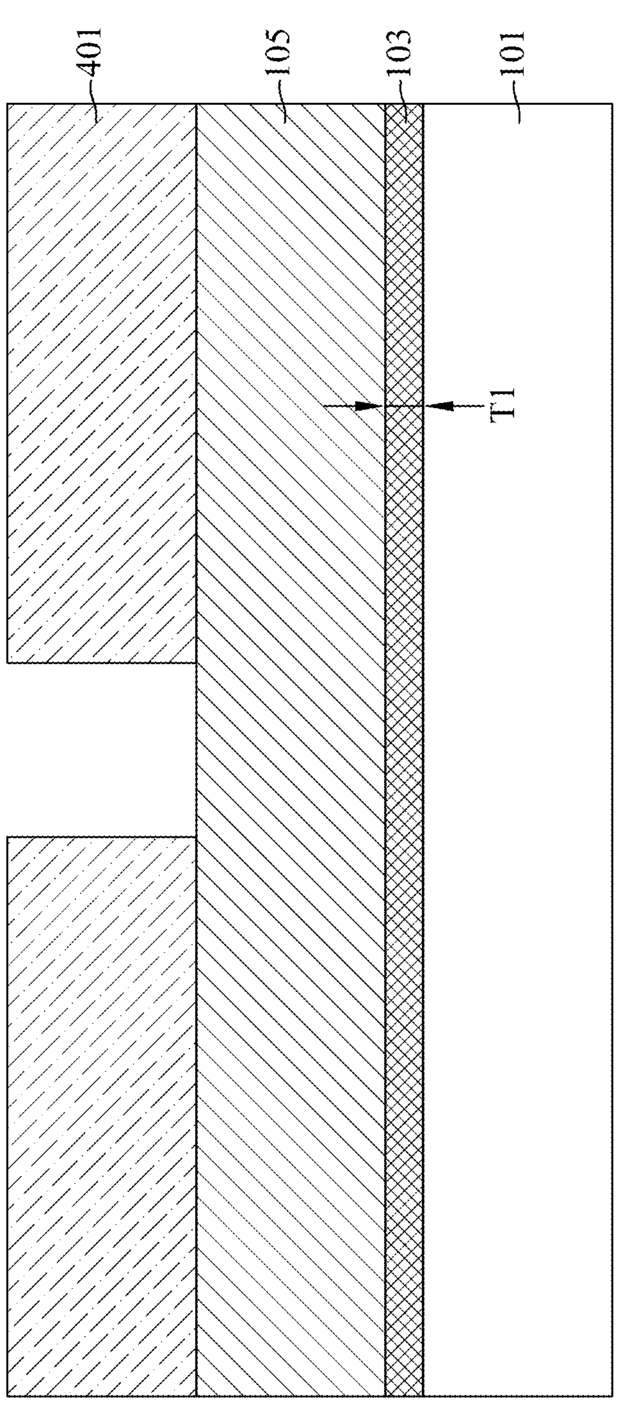
FIGS. 2 to 12 illustrate, in schematic cross-sectional view diagrams, a flow for fabricating the semiconductor device in accordance with one embodiment of the present disclosure.
Figure 3:
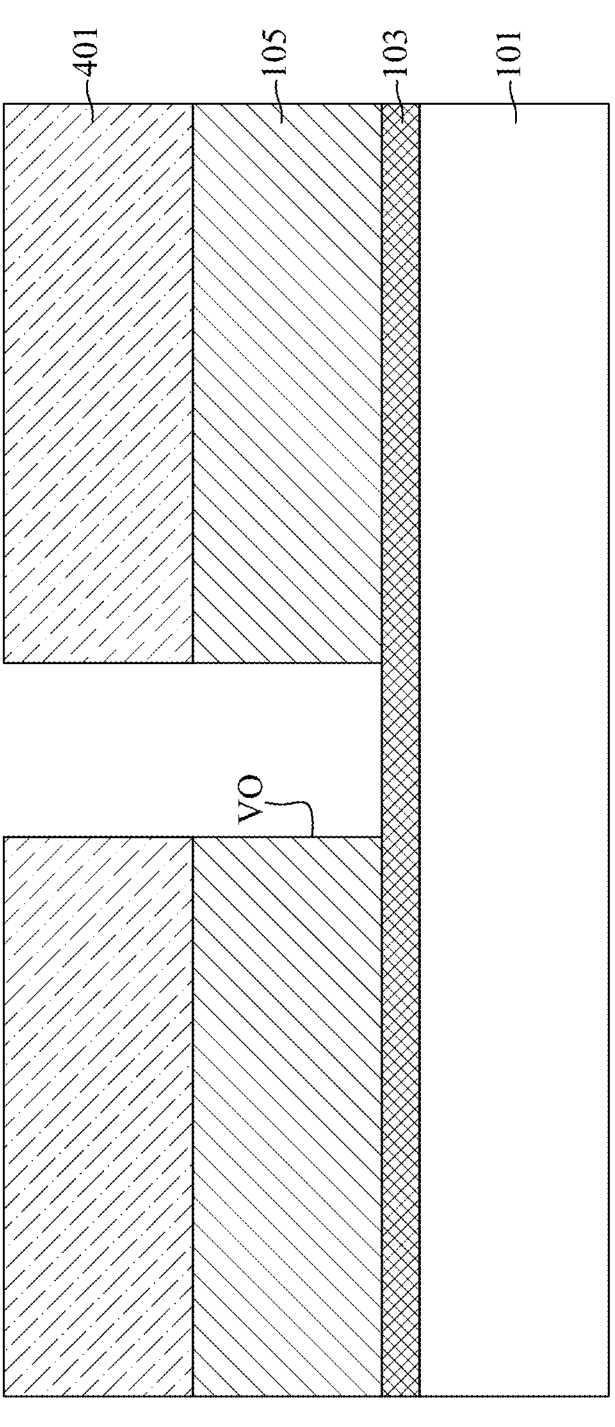

With reference to FIGS. 1 to 3, at step S11, a substrate 101 may be provided, an etch stop layer 103 may be formed on the substrate 101, a dielectric layer 105 may be formed on the etch stop layer 103, and a via opening VO may be formed to expose the etch stop layer 103.

With reference to FIG. 2, the substrate 101 may include a bulk semiconductor substrate that is composed entirely of at least one semiconductor material, a plurality of device elements (not show for clarity), a plurality of dielectric layers (not shown for clarity), and a plurality of conductive features (not show for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

With reference to FIG. 2, the plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 2, the plurality of conductive features may include interconnect layers and conductive vias. The interconnect layers may be separated from each other and may be horizontally disposed in the plurality of dielectric layers along the direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units in the substrate 101. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, the etch stop layer 103 may be formed on the substrate 101. The etch stop layer 103 may be preferably formed of a dielectric material having a different etch selectivity from the topmost layer of the substrate 101 (e.g., the dielectric layer). For example, the etch stop layer 103 may be formed of silicon carbonitride, silicon oxycarbide, or the like, and may be deposited by chemical vapor deposition or plasma enhanced chemical vapor deposition. In the present embodiment, the etch stop layer 103 is formed of silicon nitride. In some embodiments, the thickness T1 of the etch stop layer 103 may be between about 30 nm and about 40 nm, or about 35 nm.

With reference to FIG. 2, the dielectric layer 105 may be formed on the etch stop layer 103 and may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the dielectric layer 105 may include a self-planarizing material such as a spin-on glass or a spin-on low-k dielectric material such as SiLK™. The use of a self-planarizing dielectric material may avoid the need to perform a subsequent planarizing step. In some embodiments, the dielectric layer 105 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps. In the present embodiment, the dielectric layer 105 is formed of silicon dioxide.

With reference to FIG. 2, a first mask layer 401 may be formed on the dielectric layer 105. The first mask layer 401 may be, for example, a photoresist layer. The first mask layer 401 may be patterned to define the positions of the via opening VO.

With reference to FIG. 3, a via etching process may be performed to remove a portion of the dielectric layer 105 and concurrently form the via opening VO. The etch rate of the dielectric layer 105 of the via etching process may be faster than the etch rate of the etch stop layer 103 of the via etching process. For example, the etch rate ratio of the dielectric layer 105 to the etch stop layer 103 may be between about 100:1 and about 1.05:1 during the hard mask etch process. For another example, the etch rate ratio of the dielectric layer 105 to the etch stop layer 103 may be between about 100:1 and about 10:1 during the hard mask etch process. A portion of the etch stop layer 103 may be exposed through the dielectric layer 105.

Figure 4:
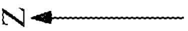
Figure 4:
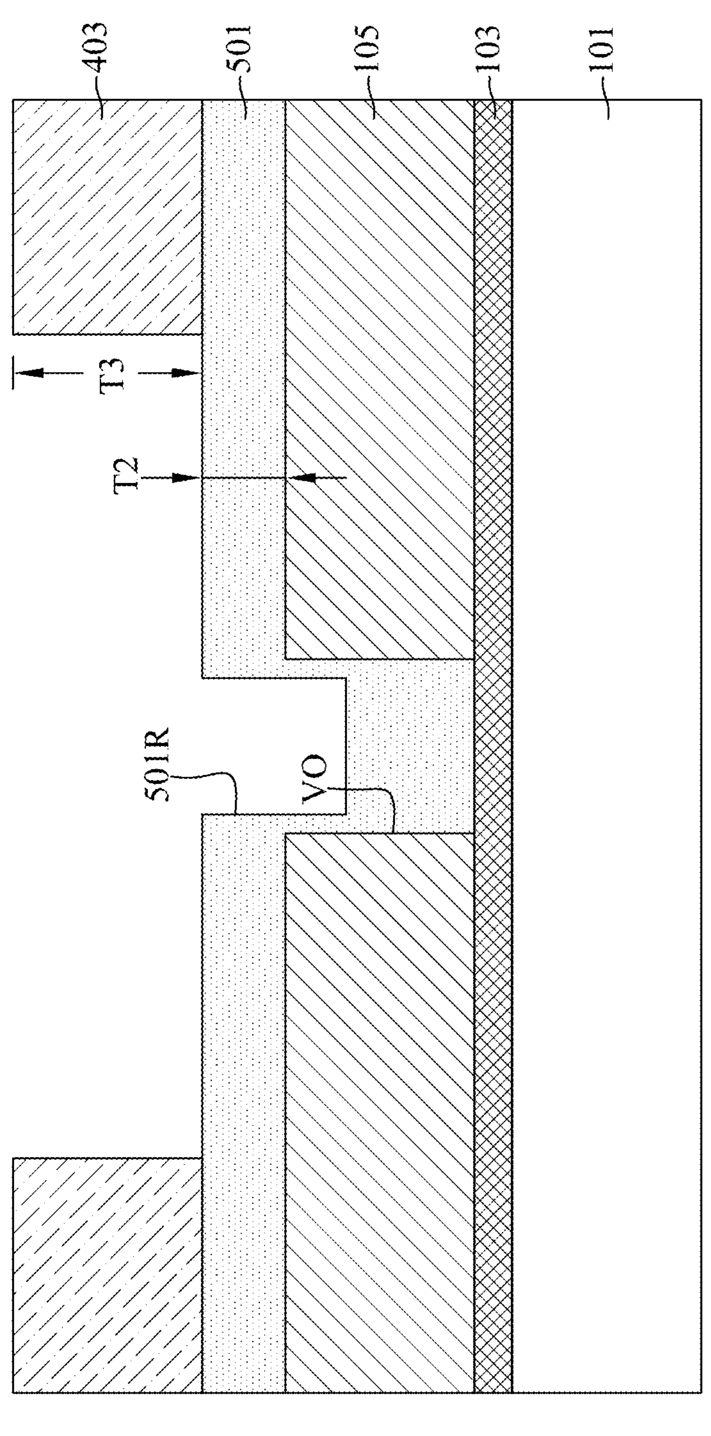

With reference to FIGS. 1 and 4, at step S13, a failed hard mask layer 501 may be formed to fill the via opening VO, and a second mask layer 403 may be formed on the failed hard mask layer 501.

With reference to FIG. 4, the failed hard mask layer 501 may be formed to fill the via opening VO by, for example, spin coating or other suitable process. In some embodiments, the failed hard mask layer 501 may be formed of a material having a slightly faster etch rate than the material of the dielectric layer 105. In some embodiments, the failed hard mask layer 501 may be, for example, AR 40 Anti-Reflectant supplied commercially by Rohm and Haas Electronic Materials (Phoenix, Ariz.) In some embodiments, the thickness T2 of the failed hard mask layer 501 may be between about 30 nm and about 50 nm, measured from the top surface of the dielectric layer 105. In some embodiments, the failed hard mask layer 501 may be formed of, for example, silicon nitride, silicon oxynitride, or silicon nitride oxide.

It should be noted that the failed hard mask layer 501 means, for example, the failed hard mask layer 501 whose size is out of spec, the failed hard mask layer 501 in which a pattern deviation is generated, or the failed hard mask layer 501 in which includes a defect such as the recess 501R directly above the via opening VO as shown in FIG. 4. The failed hard mask layer 501 may cause adverse effects to the yield and reliability of the resulting semiconductor device 1A. Therefore, the failed hard mask layer 501 needs a further treatment to avoid or alleviate such adverse effects.

With reference to FIG. 4, the second mask layer 403 may be formed on the failed hard mask layer 501. In some embodiments, the thickness T3 of the second mask layer 403 may be between about 180 nm and about 220 nm. The second mask layer 403 may include the pattern of the trench opening TO.

Figure 5:
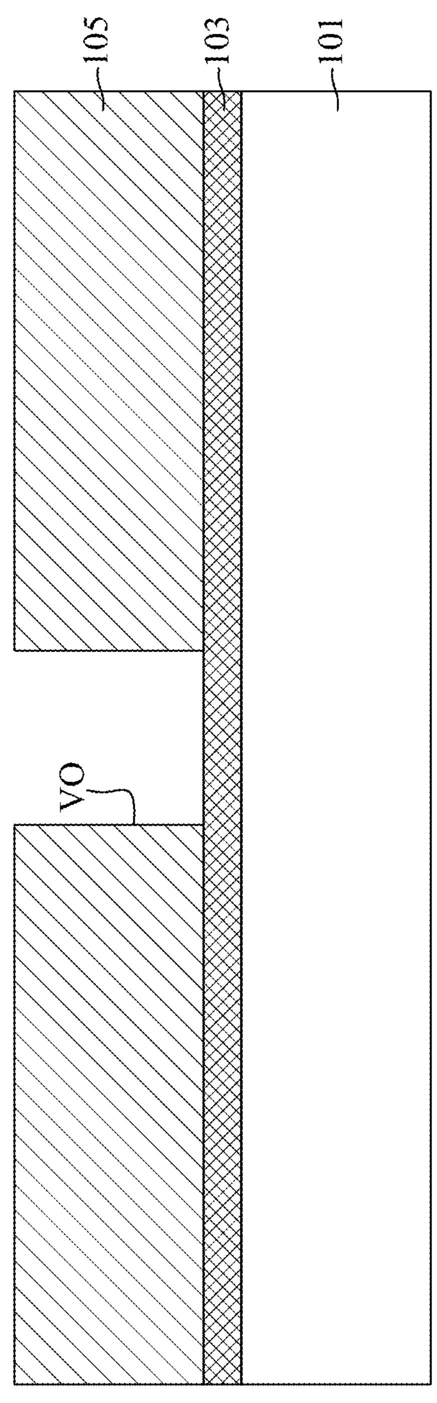
Figure 6:
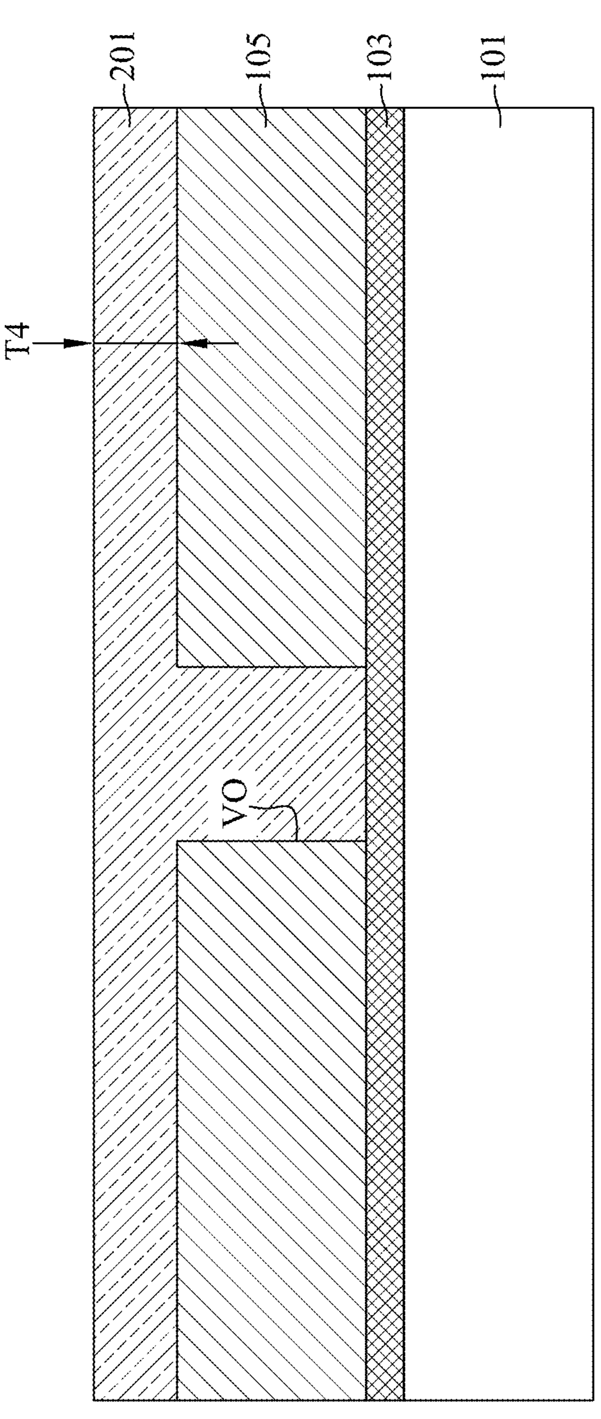

With reference to FIGS. 1, 5, and 6, at step S15, the second mask layer 403 and the failed hard mask layer 501 may be removed.

With reference to FIG. 5, the second mask layer 403 and the failed hard mask layer 501 may be removed by, for example, ashing process, etching process, other suitable process, or a combination thereof. A cleaning process may be optionally performed to remove any residue formed during the removal of the second mask layer 403 and the failed hard mask layer 501.

Figure 7:
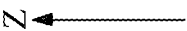
Figure 7:
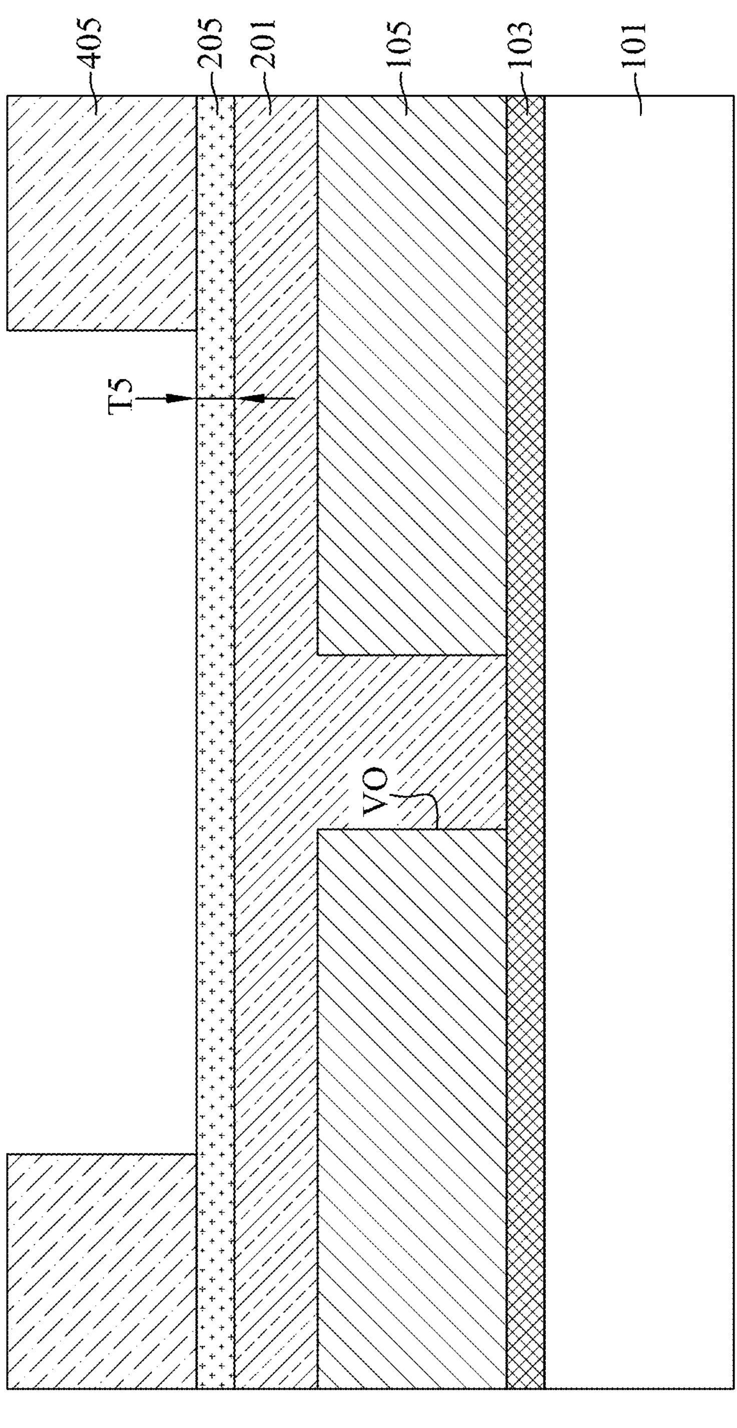

With reference to FIGS. 1, 6, and 7, at step S17, an underfill layer 201 may be formed to fill the via opening VO, a top hard mask layer 205 may be formed on the underfill layer 201, and a third mask layer 405 may be formed on the top hard mask layer 205.

With reference to FIG. 6, the underfill layer 201 may be formed to fill the via opening VO by, for example, spin coating, chemical vapor deposition, or other suitable deposition process. In some embodiments, the underfill layer 201 may be formed of, for example, silicon carbonitride, silicon oxycarbide, or the like. In some embodiments, the underfill layer 201 may be formed of a material having a slightly faster etch rate than the material of the dielectric layer 105. In some embodiments, the underfill layer 201 may be composed of carbon and hydrogen. In some embodiments, the underfill layer 201 may be composed of carbon, hydrogen, and oxygen. In some embodiments, the underfill layer 201 may be composed of carbon, hydrogen, and fluorine. In some embodiments, the underfill layer 201 may be a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

In some embodiments, the thickness T4 of the underfill layer 201 may be between about 180 nm and about 220 nm, measured from the top surface of the dielectric layer 105.

When low-k material has been used for dielectric layers (e.g., the dielectric layer 105), it has been difficult to produce features with little or no surface defects or feature deformation. It has been observed that low-k dielectric materials are often porous and susceptible to being scratched and damaged during processing, which results in defects being formed on the surface thereof. Further, low-k materials are often brittle and may deform under conventional polishing processes. One solution to limiting or reducing surface defects and deformation is to deposit a hard mask layer over the exposed low-k materials prior to patterning and etching feature definitions in the low-k materials. The hard mask layer may be resistant to damage and deformation. The hard mask layer may also protect the underlying low-k materials during subsequent material deposition and planarization or material removal processes, such as chemical mechanical polishing techniques or etching techniques, thereby reducing defect formation and feature deformation. The hard mask layer may then be removed by a following planarization process prior to subsequent processes.

With reference to FIG. 7, the top hard mask layer 205 may be formed on the underfill layer 201. In some embodiments, the thickness T5 of the top hard mask layer 205 may be between about 10 nm and about 100 nm or between about 10 nm and about 50 nm. In some embodiments, the top hard mask layer 205 may be formed of, for example, silicon, silicon germanium, tetraethyl orthosilicate, silicon nitride, silicon oxynitride, silicon nitride oxide, silicon carbide, the like, or a combination thereof. The top hard mask layer 205 may be formed by a deposition process such as chemical vapor deposition, plasma-enhanced chemical vapor deposition, atomic layer deposition, or the like. The process temperature of forming the top hard mask layer 205 may be less than 400° C. In some embodiments, the top hard mask layer 205 may be formed of, for example, metal nitrides such as titanium nitride and tantalum nitride.

Alternatively, in some embodiments, the top hard mask layer 205 may be formed of, for example, boron nitride, silicon boron nitride, phosphorus boron nitride, boron carbon silicon nitride, or the like. The top hard mask layer 205 may be formed by a film formation process and a treatment process. Detailedly, in the film formation process, first precursors, which may be boron-based precursors, may be introduced over the underfill layer 201 to form a boron-based layer. Subsequently, in the treatment process, second precursors, which may be nitrogen-based precursors, may be introduced to react with the boron-based layer and turn the boron-based layer into the top hard mask layer 205. In some embodiments, the first precursors may be, for example, diborane, borazine, or an alkyl-substituted derivative of borazine. In some embodiments, the second precursors may be, for example, ammonia or hydrazine.

During the patterning of the third mask layer 405, the top hard mask layer 205 may serve as an anti-reflection coating to improve the quality of image transferring from a photomask (not shown) to the top hard mask layer 205.

With reference to FIG. 7, the third mask layer 405 may be formed on the by a photolithography process. The third mask layer 405 may include a pattern of the trench opening TO. In some embodiments, the third mask layer 405 may be a photoresist such as commercially available photoresist OCG895i, Epic™ 2210 ArF Photoresist, or other suitable photoresists.

The procedure includes removing the second mask layer 403 and the failed hard mask layer 501, forming the underfill layer 201, forming the top hard mask layer 205, and forming the third mask layer 405 (including patterning the third mask layer 405) may be referred to as the reworking process for the failed hard mask layer 501 which is used to avoid the adverse effects of the failed hard mask layer 501 to the resulting semiconductor device 1A.

Conventional reworking process may include issues such as sidewall damage of the via opening VO and profile damage of the via opening VO. In contrast, by employing the underfill layer 201, the sidewall damage of the via opening VO and the profile damage of the via opening VO may be reduced or avoided. As a result, the yield and reliability of the resulting semiconductor device 1A may be improved.

Figure 8:
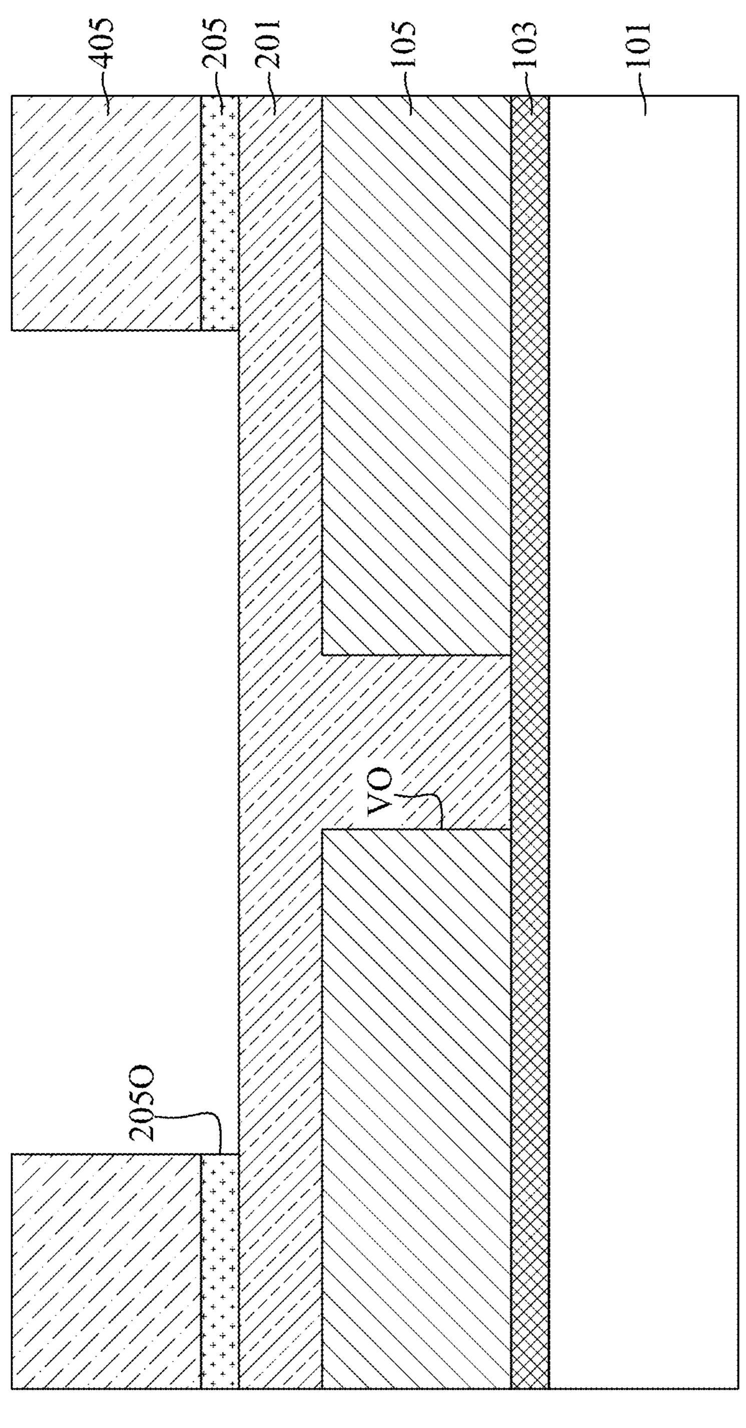
Figure 9:
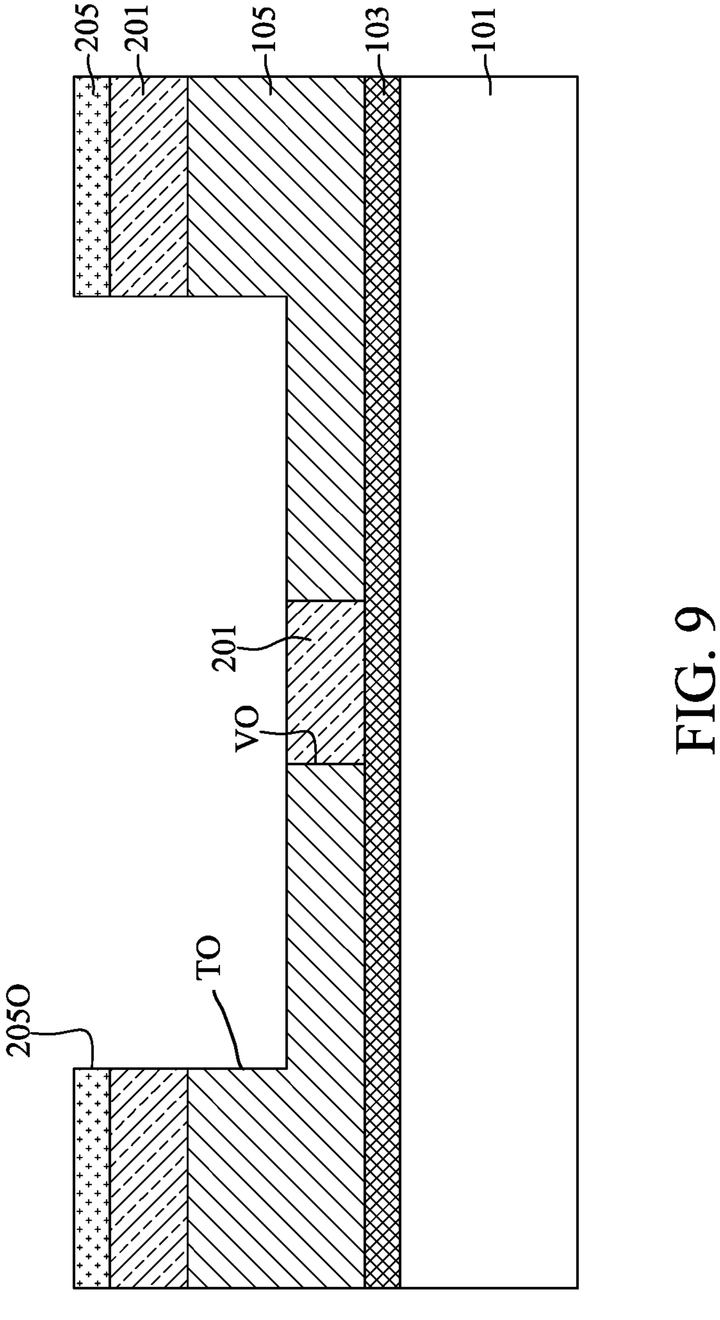

With reference to FIGS. 1, 8, and 9, at step S19, a trench opening TO may be formed in the dielectric layer 105.

With reference to FIG. 8, a hard mask etching process may be performed to remove portions of the top hard mask layer 205 and the pattern of the third mask layer 405 may be transferred to the top hard mask layer 205 to form a hard mask opening 205O along the top hard mask layer 205. The etch rate of the top hard mask layer 205 of the hard mask etching process may be faster than the etch rate of the underfill layer 201 of the hard mask etching process. For example, the etch rate ratio of the top hard mask layer 205 to the underfill layer 201 may be between about 100:1 and about 1.05:1 during the hard mask etching process. For another example, the etch rate ratio of the top hard mask layer 205 to the underfill layer 201 may be between about 100:1 and about 10:1 during the hard mask etching process. A portion of the underfill layer 201 may be exposed through the hard mask opening 205O.

With reference to FIG. 9, a trench etching process may be performed using the top hard mask layer 205 and/or the third mask layer 405 as the mask to remove portions of the dielectric layer 105 and the underfill layer 201. In some embodiments, the etch rate ratio of the dielectric layer 105 to the top hard mask layer 205 may be between about 100:1 and about 1.05:1 or between about 100:1 and about 10:1 during the trench etching process. The etch rate ratio of the underfill layer 201 to the top hard mask layer 205 may be between about 100:1 and about 1.05:1 or between about 100:1 and about 10:1 during the trench etching process. After the trench etching process, the trench opening TO may be formed in the dielectric layer 105. It should be noted that, in the current stage, the etch stop layer 103 may be still covered by the remaining underfill layer 201 in the via opening VO.

In some embodiments, the third mask layer 405 may be removed before the formation of the trench opening TO. In some embodiments, the third mask layer 405 may be removed after the trench etching process for forming the trench opening TO. The removal of the third mask layer 405 may be achieved by, for example, an ashing process or other applicable processes.

Figure 10:
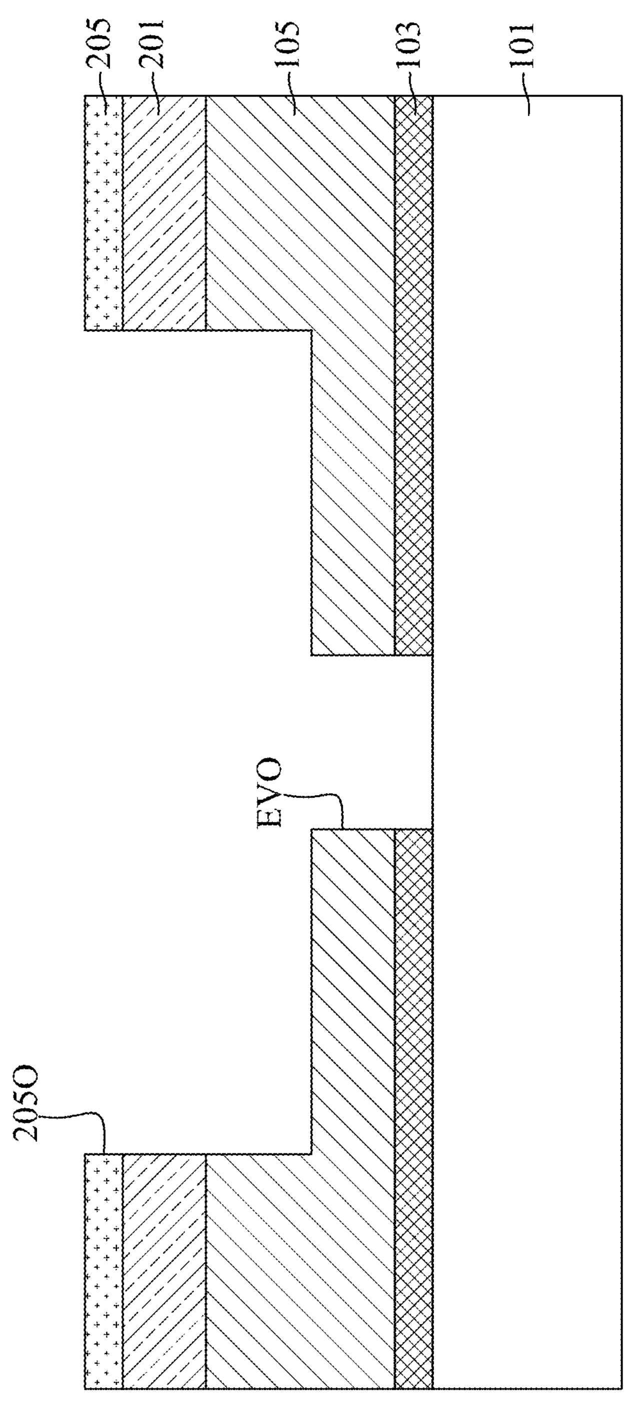

With reference to FIGS. 1 and 10, at step S21, a punch etching process may be performed to form an extended via opening EVO to expose the substrate 101.

With reference to FIG. 10, the punch etching process may remove the remaining underfill layer 201 in the via opening VO and the portion of the etch stop layer 103 exposed through the via opening VO. In some embodiments, the etch rate ratio of the underfill layer 201 to the dielectric layer 105 may be between about 100:1 and about 1.05:1 or between about 100:1 and about 10:1 during the punch etching process. In some embodiments, the etch rate ratio of the etch stop layer 103 to the substrate 101 may be between about 100:1 and about 1.05:1 or between about 100:1 and about 10:1 during the punch etching process. After the punch etching process, the via opening VO may be extended to form the extended via opening EVO along the dielectric layer 105 and the etch stop layer 103. A portion of the substrate 101 may be exposed through the extended via opening EVO.

Some etching residues (not shown for clarity) may be left after the trench etching process and/or after the punch etching process. The etching residue may be the remaining substances on the inner surface of the trench opening TO after the trench etching process, the remaining substances on the inner surface of the extended via opening EVO, or after the ashing process of the third mask layer 405. The etching residues may have different constitutions depending on the material to be etched or ashed.

In some embodiments, a pre-cleaning treatment and a cleaning process may be sequentially applied to remove aforementioned etching residues.

During the pre-cleaning treatment, the intermediate semiconductor device illustrated in FIG. 10 may be spun at a rate between about 10 rpm and about 2000 rpm or between about 100 rpm and 1000 rpm. A pre-cleaning solution may be sprayed onto the intermediate semiconductor device to cover the entire front side of the intermediate semiconductor device. Simultaneously to applying the pre-cleaning solution onto the front side of the intermediate semiconductor device, water or other suitable solution may be applied to the backside of the intermediate semiconductor device to clean the backside of the intermediate semiconductor device.

In some embodiments, the pre-cleaning solution may include chelating agent(s), corrosion inhibitor(s), amine fluoride, surfactant(s), or solvent. In some embodiments, the amine fluoride and the surfactant(s) may be optional.

Generally, the chelating agent(s) may be also known as complexing or sequestering agent(s). The chelating agent(s) may have negatively charged ions called ligands that bind with free metal ions and form a combined complex that remain soluble. The chelating agent(s) may be used to remove metallic ions from the intermediate semiconductor device. It is not bound to any particular theory, the chelating agent(s) may also reduce or avoid the underlying conductive layer (of the substrate 101) exposed through the extended via opening EVO being corroded.

In some embodiments, the chelating agent(s) of the pre-cleaning solution may include ethylenediaminetetraacetic acid, polyacrylates, carbonates, phosphonates, gluconates, N,N'-bis(2-hydroxyphenyl)ethylenediiminodiacetic acid, triethylenetetranitrilohexaacetic acid, desferriferrioxamin B, N,N',N"-tris[2-(N-hydroxycarbonyl)ethyl]-1,3,5-benzenetricarboxami de, and/or ethylenediaminediorthohydroxyphenylacetic acid. In some embodiments, the concentration of the chelating agent(s) may be between about 0.001 mg/L and about 300 mg/L or between about 0.01 mg/L and about 3 mg/L. In some embodiments, alternatively, the concentration of the chelating agent(s) may be between 1 ppm and about 400 ppm of the pre-cleaning solution or preferably about 40 ppm of the pre-cleaning solution.

The corrosion inhibitor(s) of the pre-cleaning solution may be provided to reduce or avoid the metal corrosion during the following cleaning process. In some embodiments, the corrosion inhibitor(s) may include an aliphatic alcohol compound having at least one mercapto group in the molecule. The number of carbon atoms constituting said alcohol compound is not less than 2, and a carbon atom bonded with a mercato group, and another carbon atom bonded with a hydroxyl group are contiguously bonded with each other. For example, the corrosion inhibitor(s) may be 2-mercaptoethanol and/or thioglycerol. In some embodiments, the concentration of the corrosion inhibitor(s) in the pre-cleaning solution may be between about 0.0001% and about 10% by weight or between about 0.001% and about 1% by weight. When the concentration is too low, the corrosion inhibiting effect may be limited to an unsatisfactory degree. Whereas too high concentration may not always give a further increased corrosion inhibiting effect and moreover may make it difficult to handle it due to the odor peculiar to mercapto group-carrying compounds.

Alternatively, in some embodiments, the corrosion inhibitor(s) of the pre-cleaning solution may include aromatic hydrocarbon compounds such as benzotriazole and/or 5-methylbenzimidazole. Alternatively, in some embodiments, the corrosion inhibitor(s) of the pre-cleaning solution may include uric acid, adenine, caffeine, and/or purine. Alternatively, in some embodiments, the corrosion inhibitor(s) of the pre-cleaning solution may include glyoxylic. Due to the presence of glyoxylic acid, which is a reducing material, even if a metal material is exposed during the pre-cleaning treatment, by controlling the redox potential of the pre-cleaning solution by adjusting the concentration of glyoxylic acid therein, electron transfer between the pre-cleaning solution and the exposed metal material is controlled, and corrosion of the metal material is prevented. Alternatively, in some embodiments, the corrosion inhibitor(s) of the pre-cleaning solution may include 2-mercaptoethanol, thioglycerol, benzotriazole, 5-methylbenzimidazole, uric acid, adenine, caffeine, purine, and/or glyoxylic acid.

In some embodiments, the amine fluoride of the pre-cleaning solution may include methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and/or triethylenediamine hydrofluoride. The amine fluoride may be used to remove the etching residues.

In some embodiments, the concentration of the amine fluoride in the pre-cleaning solution may be determined according to the composition of the etching residues. For example, the concentration of the amine fluoride may be between about 0.1 mass % and about 5 mass % of the entire composition of the pre-cleaning solution, or between about 0.2 mass % and about 3 mass % of the entire composition of the pre-cleaning solution. By setting the concentration of the amine fluoride in such a range, it is possible to ensure that the amine fluoride in the pre-cleaning solution is capable of removing the etching residues, while preventing the amine fluoride from corroding underlying metal material exposed through the extended via opening EVO and suppressing etching of underlying dielectric layer exposed through the extended via opening EVO. That is, if the concentration of the amine fluoride in the pre-cleaning solution is too low, the ability to remove a residue is low, and if the concentration is too high, the metal material may be corroded, and the exposed dielectric layer may be etched or undergo structural change.

The purpose of the surfactant(s) may be to prevent reattachment or redeposition of particles on the intermediate semiconductor device after they have been dislodged from the intermediate semiconductor device. Preventing the reattachment of the particles is important because allowing the particles to reattach increases overall process time. The purpose of the surfactant(s) may also include imparting affinity toward a water-repellent material layer. Generally, surfactant(s) are long hydrocarbon chains that typically contain a hydrophilic (polar water-soluble group) and a hydrophobic group (a non-polar water-insoluble group). The surfactant(s) attach with their non-polar group to particles as well as to the front side of the intermediate semiconductor device. As a result, the polar group of the surfactant(s) will point away from the wafer and away from the particles towards the pre-cleaning solution covering the front side of the intermediate semiconductor device. Because of this the particles in the solution that are bound by the surfactant will be repelled electrostatically from the front side of the intermediate semiconductor device due to the polar groups of the surfactant(s) on both the particles and the front side of the intermediate semiconductor device.

In some embodiments, the surfactant(s) of the pre-cleaning solution may include non-ionic, anionic, or a mixture of non-ionic and anionic compounds. Non-ionic means that the polar end of the surfactant has an electrostatic rather than an ionic charge and anionic means that the polar end of the surfactant has a negative ionic charge. The nonionic surfactant may be, for example, polyoxyethylene butylphenyl ether and the anionic surfactant may be, for example, polyoxyethylene alkylphenyl sulfate. In some embodiments, the concentration of the surfactant(s) of the pre-cleaning solution may be between about 1 ppm and about 100 ppm. In some embodiments, the concentration of the non-ionic surfactant(s) in the pre-cleaning solution may be about 30 ppm and the concentration of the anionic surfactant(s) in the pre-cleaning solution may be about 30 ppm. In some embodiments, the concentration of the surfactant(s) of the pre-cleaning solution may be between 0.0001 mass % and 10 mass % of the entire composition of the pre-cleaning solution, or between about 0.001 mass % and about 5 mass % of the entire composition of the pre-cleaning solution. By setting the concentration in such a range, it is possible to ensure that the wettability toward the front side of the intermediate semiconductor device is commensurate with the concentration of the surfactant(s).

In some embodiments, the solvent of the pre-cleaning solution may be deionized water.

In some embodiments, the front side of the intermediate semiconductor device illustrated in FIG. 10 may be covered (or immersed) by the pre-cleaning solution for about 2 minutes. Next, the intermediate semiconductor device may be rinsed using deionized water to remove the pre-cleaning solution.

In some embodiments, a drying process may be performed after the pre-cleaning treatment. The drying process may be performed by spinning between about 100 rpm and about 6000 rpm, or about 3000 rpm, for about 20 seconds and using the air flow to dry the intermediate semiconductor device. In some embodiments, nitrogen or isopropyl alcohol may be used to facilitate the dry process. In some embodiments, the dry process may be optional. That is, the cleaning process may be directly performed after the rinsing of the pre-cleaning solution.

In some embodiments, the cleaning process may include three stages with inter-stage rinses between stages. Detailedly, during the first stage of the cleaning process, a first cleaning solution may be applied to the intermediate semiconductor device after the pre-cleaning treatment (or the drying process). The first cleaning solution may be rinsed by the first inter-stage rinse. During the second stage of the cleaning process, a second cleaning solution may be applied to the intermediate semiconductor device and the second cleaning solution may be subsequently rinsed by a second inter-stage rinse. During the third stage of the cleaning process, a third cleaning solution may be applied to the intermediate semiconductor device and then be rinsed by a post-stage rinse.

In some embodiments, during the first stage of the cleaning process, the intermediate semiconductor device after the pre-cleaning treatment may be spun at a rate between about 10 rpm and about 2000 rpm or between about 100 rpm and 1000 rpm. The first cleaning solution may be sprayed onto the intermediate semiconductor device to cover the entire front side of the intermediate semiconductor device. Simultaneously to applying the first cleaning solution onto the front side of the intermediate semiconductor device, water or other suitable solution may be applied to the backside of the intermediate semiconductor device to clean the backside of the intermediate semiconductor device.

In some embodiments, the first cleaning solution may include diluted hydrofluoric acid. The concentration of the first cleaning solution may be between about 5 parts deionized water to one part hydrofluoric acid and about 1000 parts deionized water to one part hydrofluoric acid, about 300 parts deionized water to one part hydrofluoric acid, or about 50 parts deionized water to one part hydrofluoric acid. Generally, the front side of the intermediate semiconductor device may be exposed to the first cleaning solution for a time sufficient to etch either a sacrificial oxide (typically around 50 angstroms to 200 angstroms) or a native oxide (typically around 10 angstroms.) In some embodiments, the process time of the first stage of the cleaning process may be between about 20 seconds and about 50 seconds, about 40 seconds, or about 30 seconds. In some embodiments, the process time of the first stage of the cleaning process may be between about 1 minutes and about 5 minutes.

In some embodiments, the first cleaning solution may further include fluoride compound(s), organic acid salt(s), and/or glyoxylic acid.

The fluorine compound(s) may be contained in the first cleaning solution as a component for removing the etching residues. Examples of the fluorine compound(s) may include hydrofluoric acid and ammonium or amine fluoride salts such as, for example, ammonium fluoride, ammonium hydrogen fluoride, methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and triethylenediamine hydrofluoride. In some embodiments, the concentration of the fluorine compound(s) in the first cleaning solution may be determined according to the composition of the etching residues. For example, the concentration of the fluorine compound(s) may be between about 0.1 mass % and about 5 mass % of the entire composition of the first cleaning solution, or between about 0.2 mass % and about 3 mass % of the entire composition of the first cleaning solution.

The organic acid salt(s) may include, for example, ammonium oxalate, ammonium tartarate, ammonium citrate, and ammonium acetate. The organic acid salt(s) may act as a pH adjusting agent(s) or buffer agent(s) in the first cleaning solution. The concentration of the organic acid salt(s) may be between about 0.1 mass % and about 10 mass % of the entire composition of the first cleaning solution, or between about 0.3 mass % and about 5 mass % of the entire composition of the first cleaning solution.

The glyoxylic contained in the first cleaning solution may serve as a corrosion inhibitor.

In some embodiments, the first cleaning solution may further include a resist removal component. Examples of the resist removal component include tetramethylammonium hydroxide and/or monomethanolamine.

The first inter-stage rinse may be performed after the first stage of the cleaning process. During the first inter-stage rinse, the intermediate semiconductor device after the first stage of the cleaning process may be rotated at between about 10 rpm and about 1000 rpm while being rinsed with deionized water. In some embodiments, the rinse temperature may be between about 19° C. and about 23° C. In some embodiments, the process time of the first inter-stage rinse may be between about 20 seconds and about 50 seconds, or about 30 seconds.

In some embodiments, the deionized water used for the first inter-stage rinse may be oxygenated or ozonated by dissolving oxygen gas or ozone gas before rinsing the intermediate semiconductor device. Dissolved oxygen or ozone may be added to the deionized water in a concentration of greater than 1 ppm to serve as an oxidant. For example, the concentration of dissolved oxygen or ozone may be between about 1 ppm and about 200 ppm or between about 2 ppm and about 20 ppm. For another example, the deionized water may be saturated with dissolved oxygen or ozone. Alternatively, hydrogen peroxide may be added to the deionized water in a concentration of greater than 100 ppm to serve as an oxidant. Whichever oxidant is used, it should have an oxidation potential sufficient to oxidize the most noble metal in the solution. Copper ($Cu^{2+}$), with a standard reduction potential of 0.3V, is usually the most noble metal present. Therefore, a standard reduction potential of greater than 0.5V is desired. Oxygen or ozone will solvate the metal ions and prevent precipitation by oxidizing the metal ions that are in solution. This will help decrease the processing time by making the first inter-stage rinse more effective.

In some embodiments, the deionized water used for the first inter-stage rinse may carbon dioxide dissolved into it to dissipate static electricity that builds up in the deionized water. Static electricity builds up in the deionized water may originate from the rotation of the intermediate semiconductor device. The dissolved carbon dioxide may also make the deionized water more acidic and therefore reduces any metallic contamination. In some embodiments, carbon dioxide may be dissolved into the deionized water in an amount sufficient to dissipate static electricity. For example, the amount of carbon dioxide dissolved into the deionized water may be sufficient to decrease the resistivity of the deionized water to less than 5 Megaohm·cm.

In some embodiments, the deionized water used for the first inter-stage rinse may have isopropyl alcohol, or any other liquid with a surface tension lower than that of the deionized water, added to it. Isopropyl alcohol may aid by making the deionized water spread out over the front side of the intermediate semiconductor device so that the chemicals are removed more quickly. Isopropyl alcohol may also help the rinse spin off of the intermediate semiconductor device during spinning. Alternatively, isopropyl alcohol vapor may be blown onto the front side of the intermediate semiconductor device while rinsing to assist the first inter-stage rinse.

In some embodiments, the deionized water used to remove the pre-cleaning solution may have treatments similar to the deionized water used during the first inter-stage rinse.

In some embodiments, during the second stage of the cleaning process, the intermediate semiconductor device after the first inter-stage rinse may be spun at a rate between about 10 rpm and about 2000 rpm or between about 100 rpm and 1000 rpm. The second cleaning solution may be sprayed onto the intermediate semiconductor device to cover the entire front side of the intermediate semiconductor device. Simultaneously to applying the second cleaning solution onto the front side of the intermediate semiconductor device, water or other suitable solution may be applied to the backside of the intermediate semiconductor device to clean the backside of the intermediate semiconductor device.

In some embodiments, the second cleaning solution may be an alkaline solution including, for example, aqueous solutions of inorganic compounds such as sodium hydroxide, potassium hydroxide and ammonium hydroxide, and aqueous solution of organic compounds such as tetramethylammonium hydroxide and choline. The second cleaning solution may also include hydrogen peroxide. The purpose of the ammonium hydroxide and the hydrogen peroxide in the second cleaning solution is to remove particles and residual organic contaminants from the front side of the intermediate semiconductor device.

For example, in the present embodiment, the second cleaning solution may include ammonium hydroxide, hydrogen peroxide, and water. The ammonium hydroxide, hydrogen peroxide, and water may be present in concentrations defined by dilution ratios of between 5/1/1 to 1000/1/1, respectively. In some embodiments, the ammonium hydroxide/hydrogen peroxide ratio may be varied between 0.05/1 and 5/1. In some embodiments, no hydrogen peroxide is used at all. The ammonium hydroxide in the second cleaning solution would be from a solution of 28-29% w/w of ammonia to water. The hydrogen peroxide in the second cleaning solution would be from a solution of 31-32% w/w of hydrogen peroxide to water. The pH of the second cleaning solution may be between about 9 and 12 or between about 10 and 11 due to the ammonium hydroxide and the hydrogen peroxide.

In some embodiments, the second cleaning solution may further include chelating agent(s). The chelating agent(s) of the second cleaning solution may have compound(s) and concentration similar to the chelating agent(s) contained in the pre-cleaning solution, and descriptions thereof are not repeated herein.

In some embodiments, the second cleaning solution may further include surfactant(s). The surfactant(s) of the second cleaning solution may have compound(s) and concentration similar to the surfactant(s) contained in the pre-cleaning solution, and descriptions thereof are not repeated herein.

In some embodiments, the second cleaning solution may further include dissolved hydrogen gas. The dissolved hydrogen gas in the second cleaning solution may provide cavitation (bubble creation) to the second cleaning solution. Providing cavitation to the second cleaning solution may enhance the cleaning process. In some embodiments, the concentration of the dissolved hydrogen gas may be between about 0.01 mg/L and about 5 mg/L or between about 0.1 mg/L and about 5 mg/L. In some embodiments, other suitable cavitation gases such as nitrogen, helium, Argon, or oxygen may also be used. For example, dissolved oxygen having concentration between about 1 mg/L and about 20 mg/L may be used in the second cleaning solution.

In some embodiments, the process time of the second stage of the cleaning process may be between about 30 seconds and about 100 seconds, between about 30 seconds and 90 seconds, or between about 30 seconds and about 60 seconds. In some embodiments, the temperature of the second cleaning solution may be between about 40° C. and about 85° C.

The second inter-stage rinse may be performed after the second stage of the cleaning process. The second inter-stage rinse may be performed with a procedure similar to the first inter-stage rinse, and descriptions thereof are not repeated herein.

In some embodiments, during the third stage of the cleaning process, the intermediate semiconductor device after the second inter-stage rinse may be spun at a rate between about 10 rpm and about 2000 rpm or between about 100 rpm and 1000 rpm. The third cleaning solution may be sprayed onto the intermediate semiconductor device to cover the entire front side of the intermediate semiconductor device. Simultaneously to applying the third cleaning solution onto the front side of the intermediate semiconductor device, water or other suitable solution may be applied to the backside of the intermediate semiconductor device to clean the backside of the intermediate semiconductor device.

In some embodiments, the third cleaning solution may be an acidic solution including, for example, aqueous solution of inorganic acids such as hydrochloric acid, hydrofluoric acid, sulfuric acid and nitric acid, and aqueous solution of organic acids such as oxalic acid, citric acid, malonic acid, malic acid, fumaric acid and maleic acid. In some embodiments, the third cleaning solution may also include hydrogen peroxide. The concentration of the acidic solution may be between about 0.001% and about 10% by weight or between about 0.01% and about 5% by weight. When the concentration is too low, the washing effect may not be obtained sufficiently. When the concentration is too high, metal-corrosion of the washing apparatus or the other related apparatus may occur.

A post-stage rinse may be performed after the third stage of the cleaning process. The post-stage rinse may be performed with a procedure similar to the first inter-stage rinse, and descriptions thereof are not repeated herein.

In some embodiments, the second stage and the third stage of the cleaning process may be optional. In other words, only the first stage of the cleaning process may be performed. In some embodiments, the third stage of the cleaning process may be optional. In other words, only the first stage and the second stage of the cleaning process may be performed.

Figure 11:
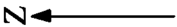
Figure 11:
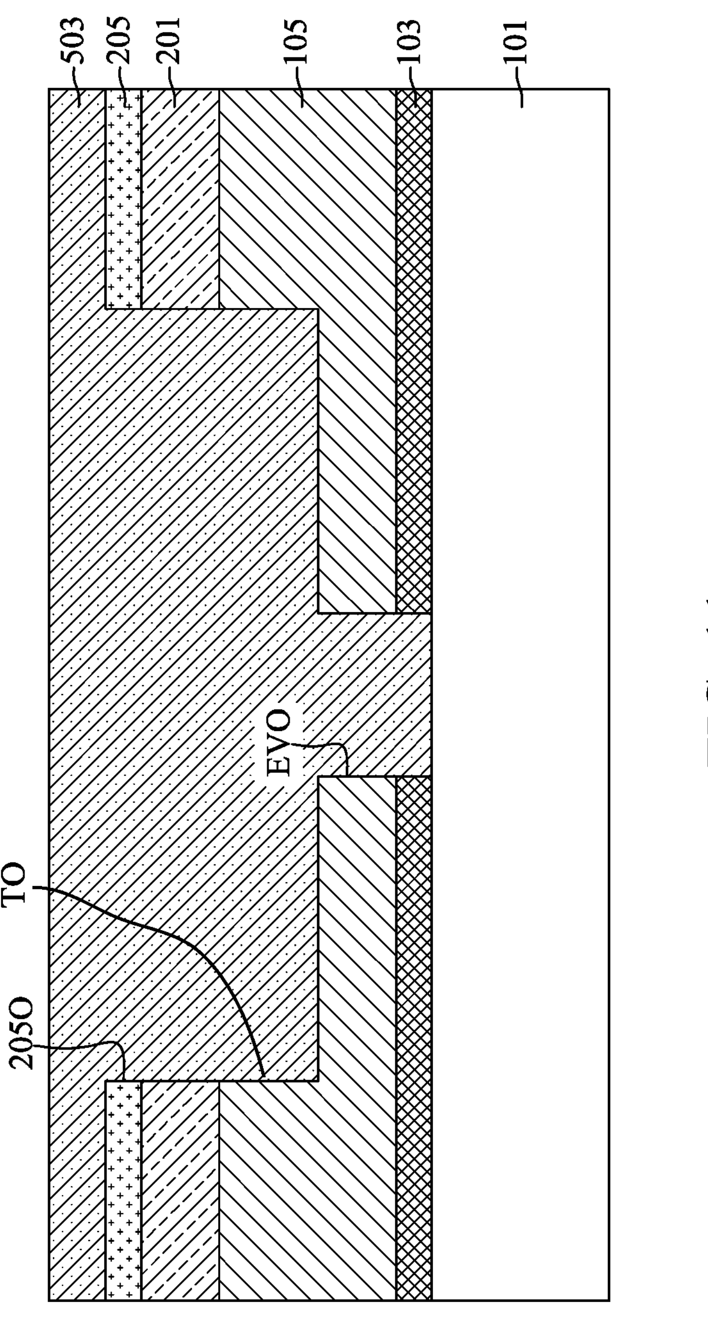
Figure 12:
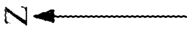
Figure 12:
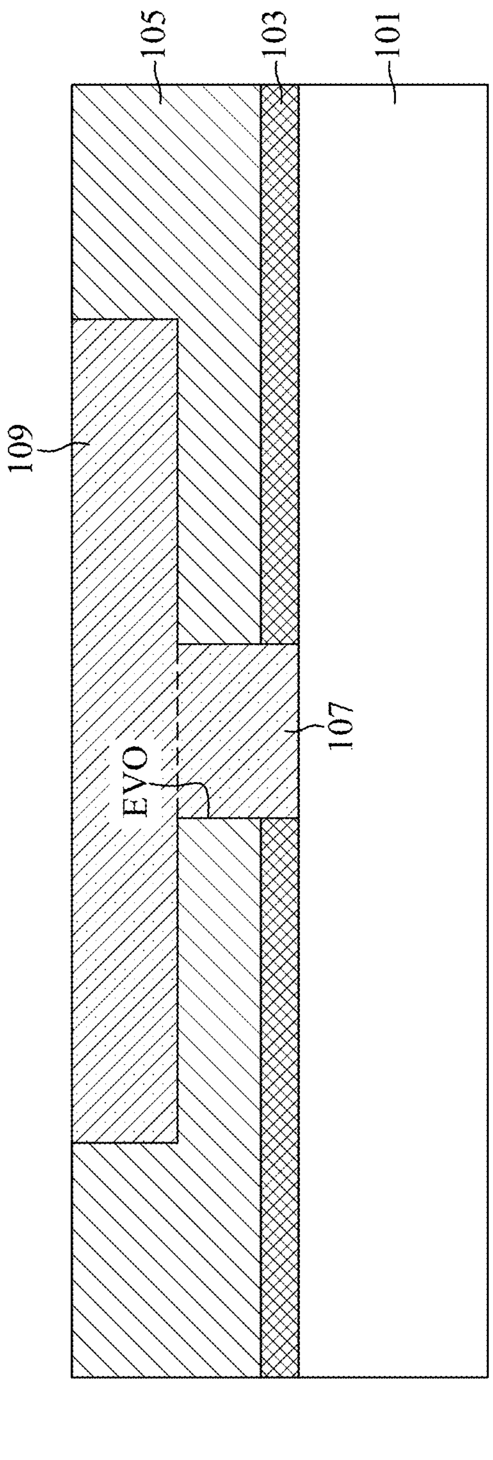

With reference to FIGS. 1, 11, and 12, at step S23, a via 107 may be formed in the extended via opening EVO, and a trench 109 may be formed in the trench opening TO.

With reference to FIG. 11, a layer of conductive material 503 may be formed to completely fill the extended via opening EVO and the trench opening TO. The conductive material may be, for example, copper. The layer of conductive material 503 may be formed by, for example, chemical vapor deposition, physical vapor deposition, sputtering, or other applicable deposition process.

With reference to FIG. 8, a planarization process, such as chemical mechanical polishing, may be performed until the top surface of the dielectric layer 105 is exposed to remove excess material and provide a substantially flat surface for subsequent processing steps. After the planarization process, the layer of conductive material 503 may be turned into the via 107 in the extended via opening EVO and the trench 109 in the trench opening TO. The substrate 101, the first etch stop layer 103, the dielectric layer 105, the via 107, and the trench 109 together configure the semiconductor device 1A.

Figure 13:
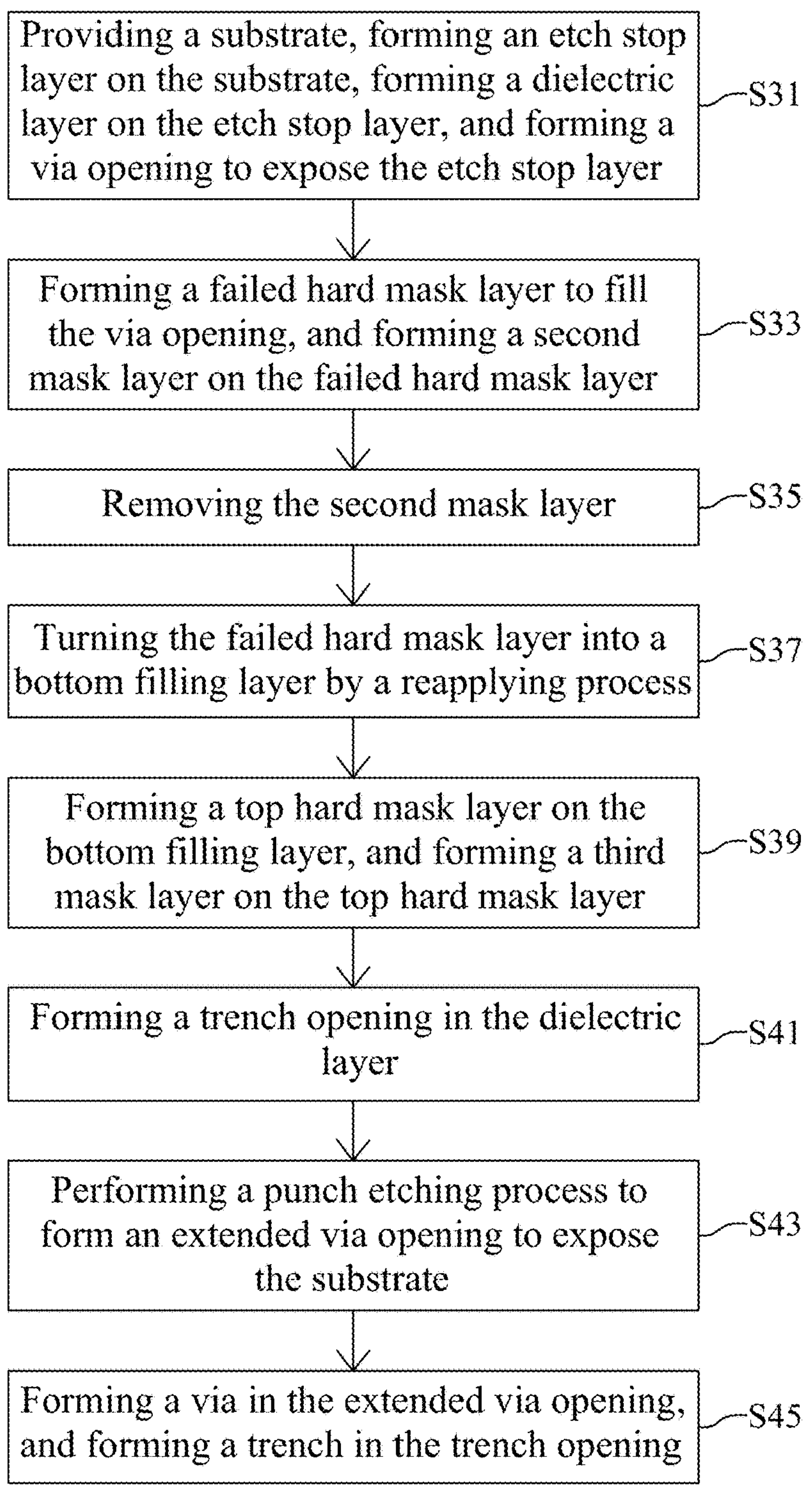
FIG. 13 illustrates, in a flowchart diagram form, a method for fabricating a semiconductor device in accordance with another embodiment of the present disclosure.

FIG. 13 illustrates, in a flowchart diagram form, a method 30 for fabricating a semiconductor device 1B in accordance with another embodiment of the present disclosure;

FIGS. 14 to 24 illustrate, in schematic cross-sectional view diagrams, a flow for fabricating the semiconductor device 1B in accordance with another embodiment of the present disclosure.

Figure 14:
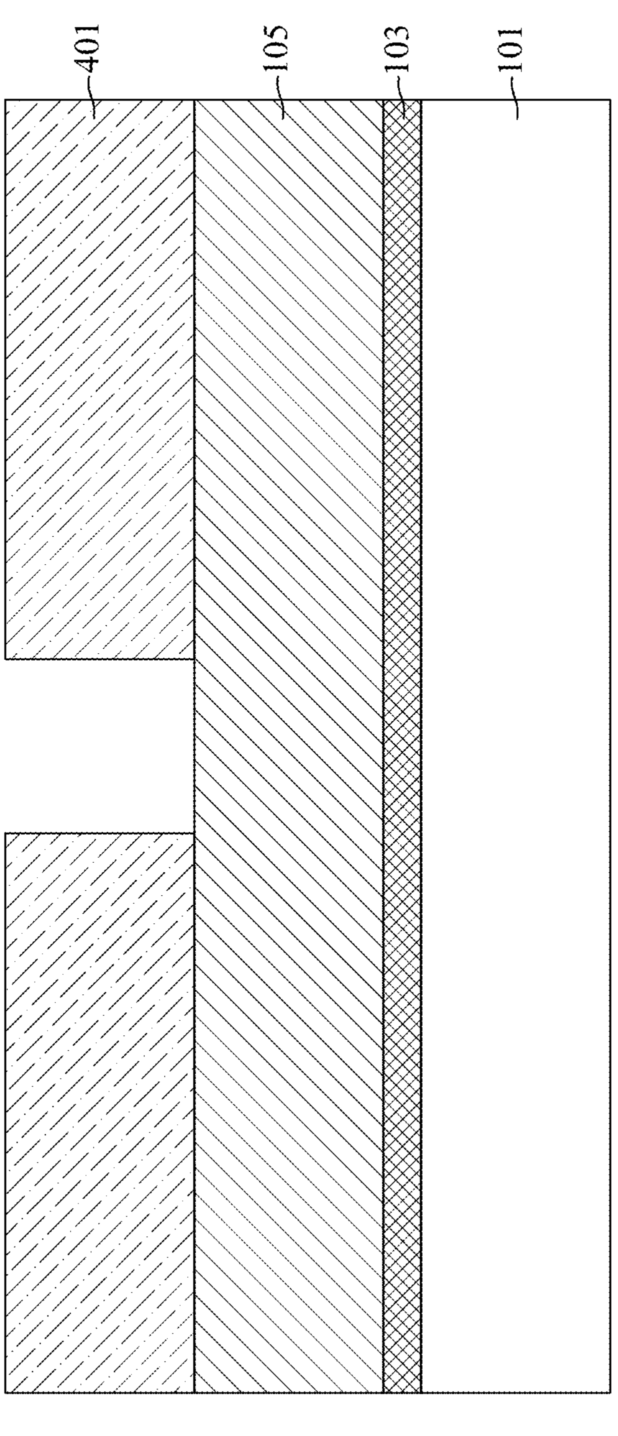
FIGS. 14 to 24 illustrate, in schematic cross-sectional view diagrams, a flow for fabricating the semiconductor device in accordance with another embodiment of the present disclosure.
Figure 15:
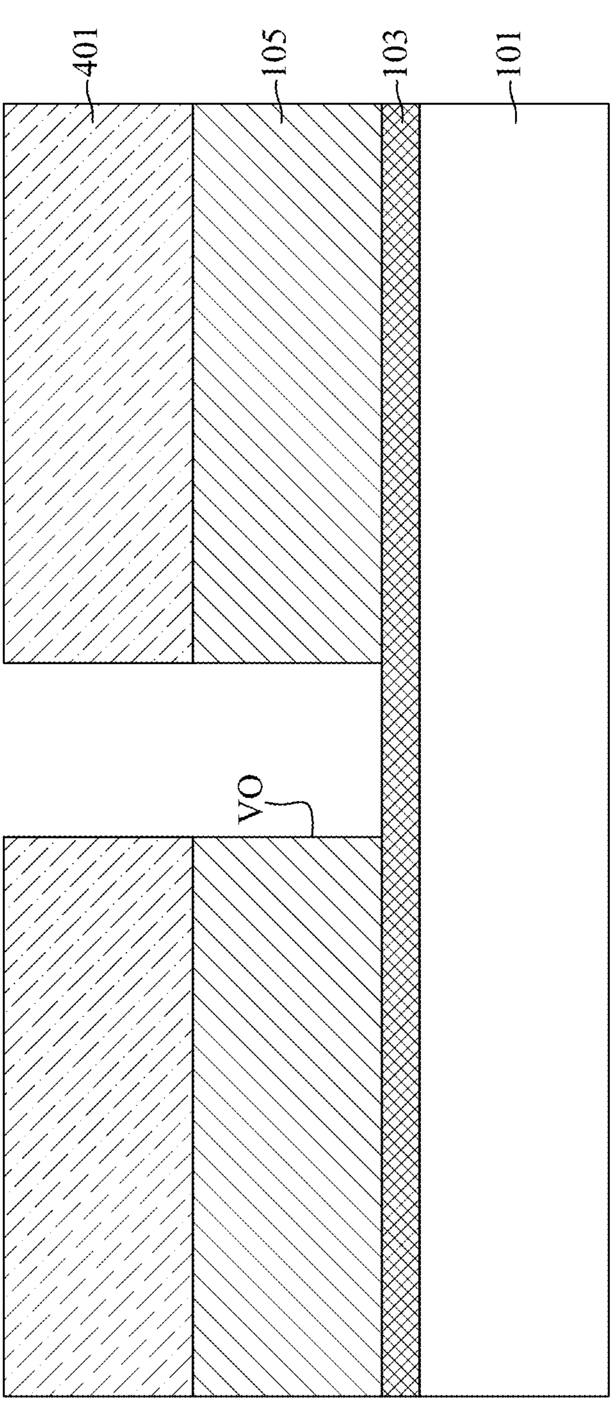

With reference to FIGS. 13 to 15, at step S31, a substrate 101 may be provided, an etch stop layer 103 may be formed on the substrate 101, a dielectric layer 105 may be formed on the etch stop layer 103, and a via opening VO may be formed to expose the etch stop layer 103.

With reference to FIG. 14, the substrate 101, the etch stop layer 103, the dielectric layer 105, and the first mask layer 401 may be formed with a procedure similar to that illustrated in FIG. 2, and descriptions thereof are not repeated herein.

With reference to FIG. 15, the via opening VO may be formed along the dielectric layer 105 and exposing the etch stop layer 103 with a procedure similar to that illustrated in FIG. 3, and descriptions thereof are not repeated herein.

Figure 16:
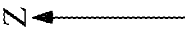
Figure 16:
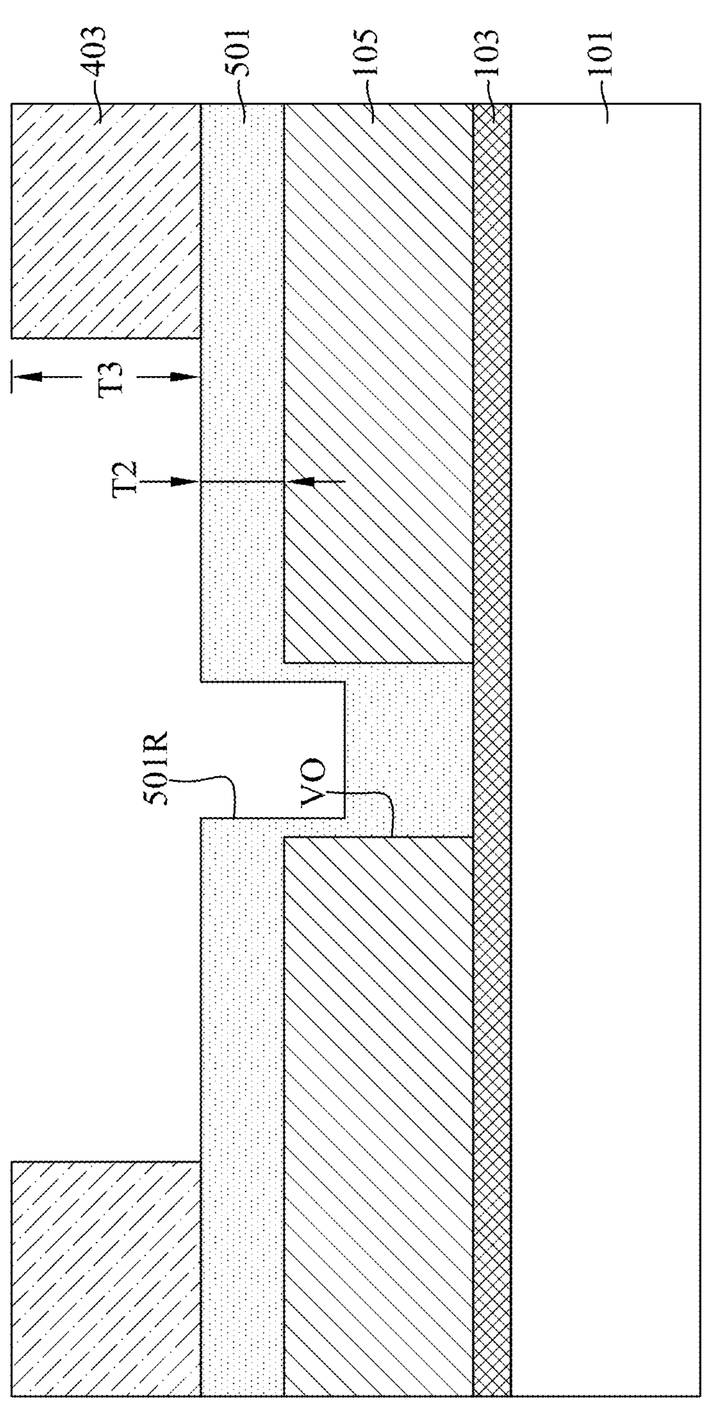

With reference to FIGS. 13 and 16, at step S33, a failed hard mask layer 501 may be formed to fill the via opening VO, and a second mask layer 403 may be formed on the failed hard mask layer 501.

With reference to FIG. 16, the failed hard mask layer 501 and the second mask layer 403 may be formed with a procedure similar to that illustrated in FIG. 4, and descriptions thereof are not repeated herein.

Figure 17:
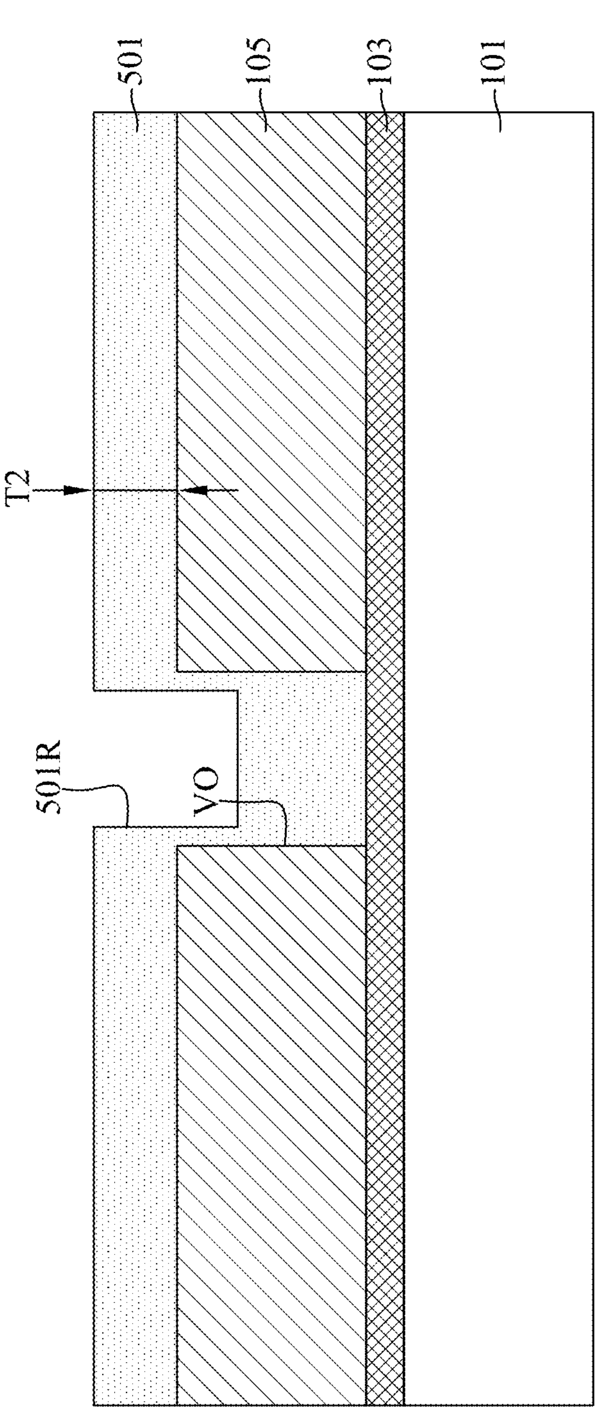

With reference to FIGS. 13 and 17, at step S35, the second mask layer 403 may be removed.

With reference to FIG. 17, the third mask layer 405 may be selectively removed. The removal of the third mask layer 405 may be achieved by, for example, an ashing process or an applicable etching process. In some embodiments, the etch rate ratio of the third mask layer 405 to the failed hard mask layer 501 may be between about 100:1 and about 1.05:1 or between about 100:1 and about 10:1 during the removal of the third mask layer 405.

Figure 18:
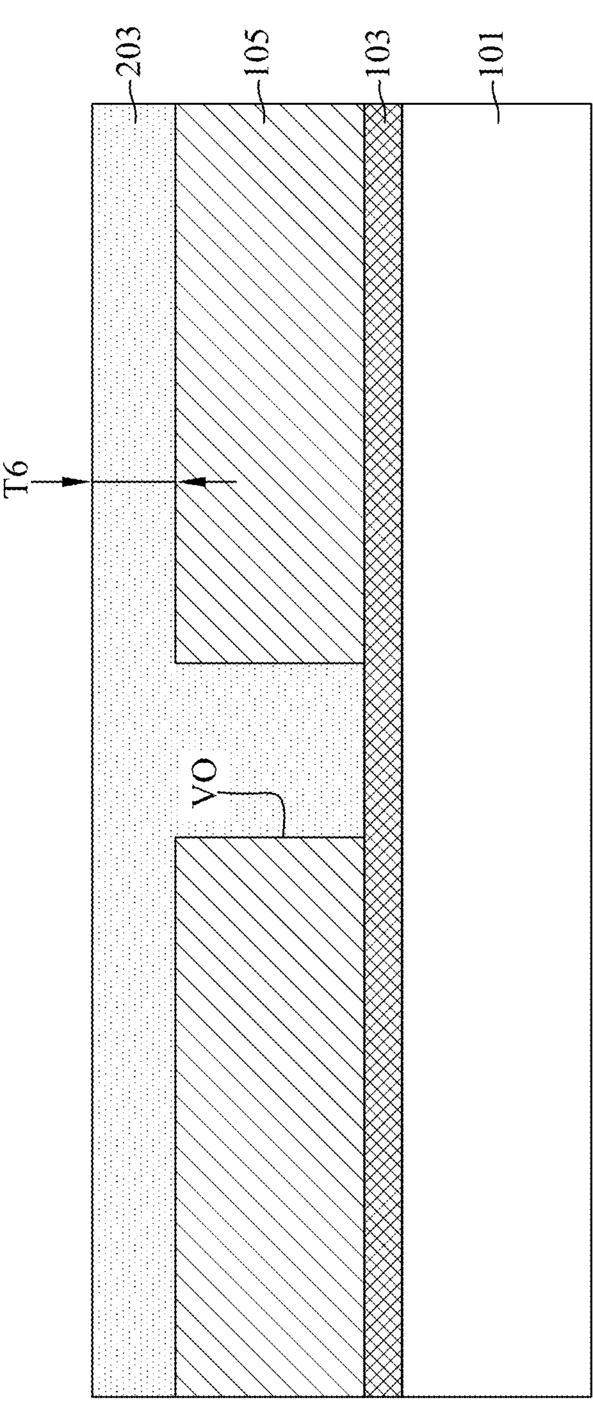

With reference to FIGS. 13 and 18, at step S37, the failed hard mask layer 501 may be turned into a bottom filling layer 203 by a reapplying process.

With reference to FIG. 18, in some embodiments, the reapplying process may be, for example, spin coating process, chemical vapor deposition, physical vapor deposition, sputtering, or other suitable deposition process. The reapplying process may patch defects of the failed hard mask layer 501 (e.g., the recess 501R). After the reapplying process, the failed hard mask layer 501 may be turned into the bottom filling layer 203. In some embodiments, the thickness T6 of the bottom filling layer 203 may be between about 180 nm and about 220 nm. The bottom filling layer 203 may be formed of the same material as the failed hard mask layer 501, and descriptions thereof are not repeated herein. In some embodiments, a planarization process, such as chemical mechanical polishing or other suitable process, may be performed to provide a substantially flat surface for subsequent processing steps. In some embodiments, the planarization process may be omitted.

Conventionally, the removal of the failed hard mask layer 501 may enlarge the via opening VO and/or damage the profile of the via opening VO. In the present embodiment, employing the reapplying to fix the failed hard mask layer 501 instead of removing it may alleviate or avoid the enlargement of the via opening VO or the damage to the profile of the via opening VO With reference to FIGS. 13 and 19, at step S39, a top hard mask layer 205 may be formed on the bottom filling layer 203, and a third mask layer 405 may be formed on the top hard mask layer 205.

Figure 19:
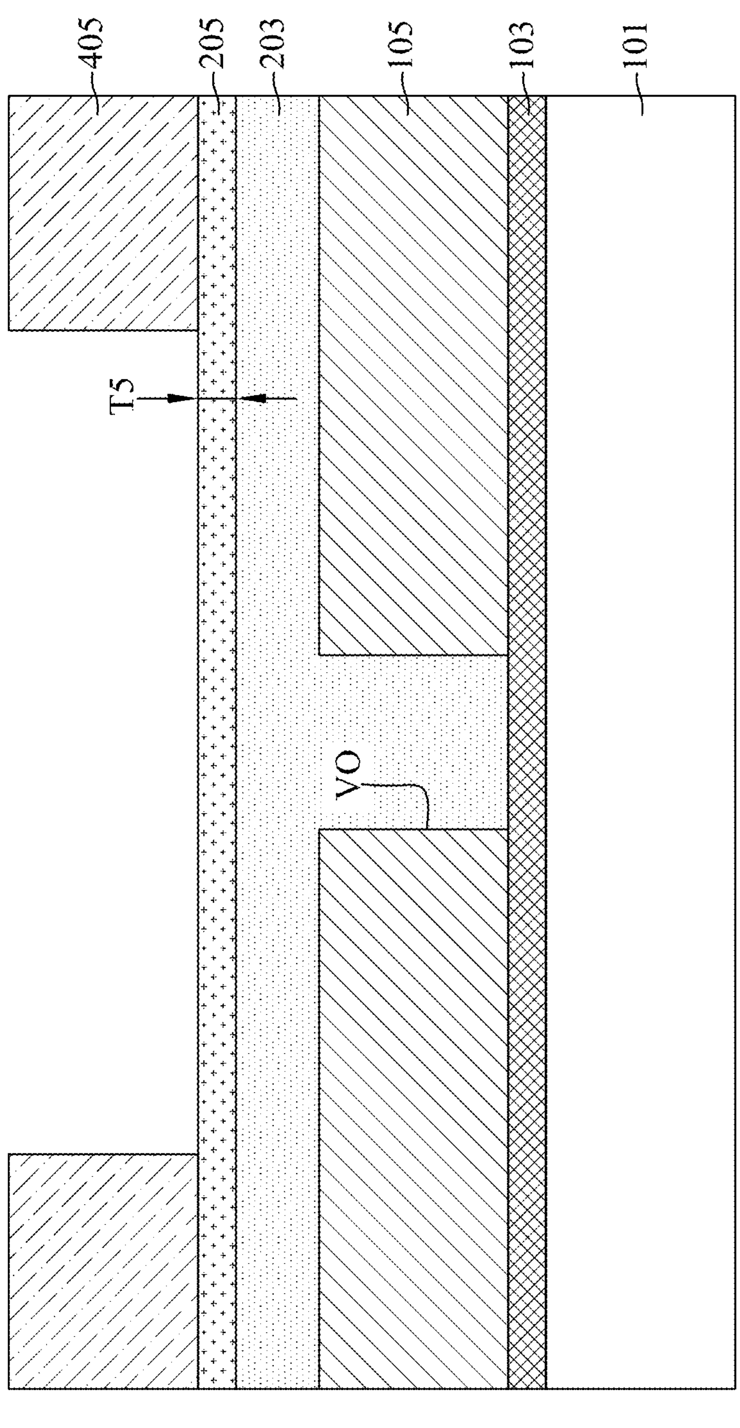

With reference to FIG. 19, the top hard mask layer 205 and the third mask layer 405 may be formed with a procedure similar to that illustrated in FIG. 7, and descriptions thereof are not repeated herein.

The procedure includes removing the third mask layer 405, forming the bottom filling layer 203 by the reapplying process, forming the top hard mask layer 205, and forming the third mask layer 405 (including patterning the third mask layer 405) may be referred to as the reworking process for the failed hard mask layer 501 which is used to avoid the adverse effects of the failed hard mask layer 501 to the resulting semiconductor device 1B.

Figure 20:
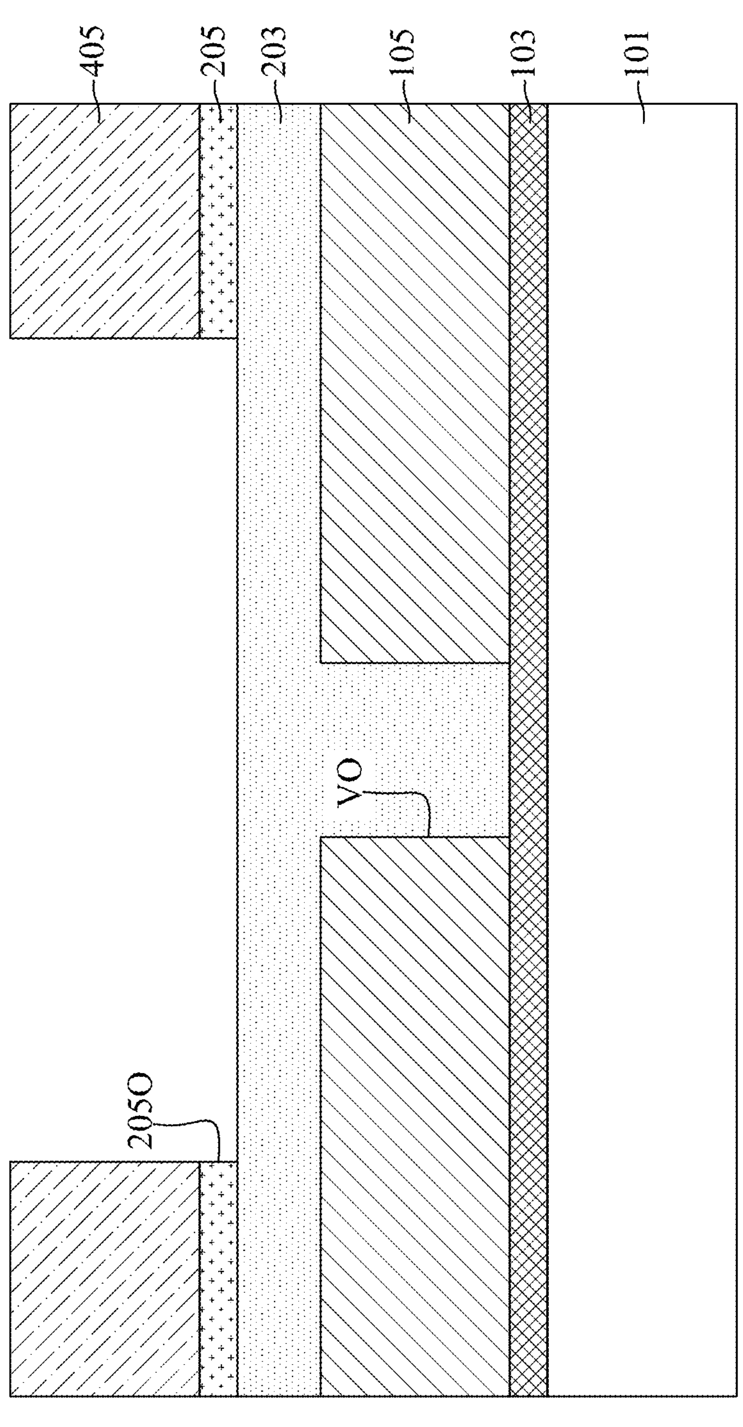
Figure 21:
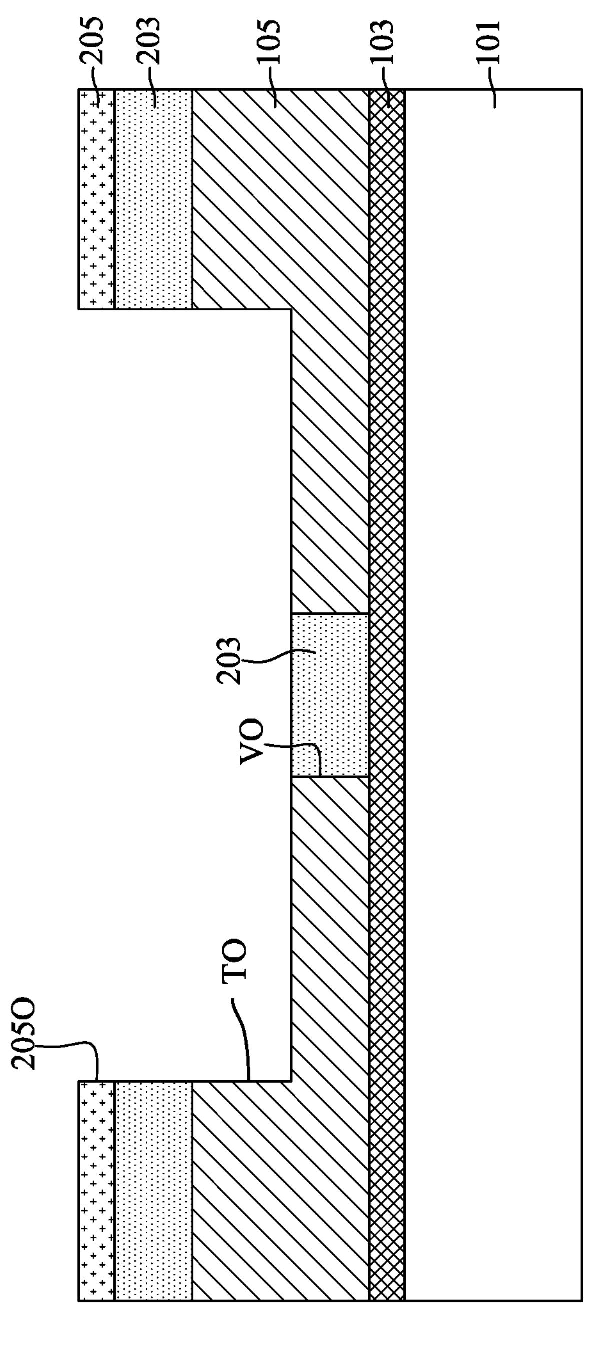

With reference to FIGS. 13, 20, and 21, at step S41, a trench opening TO may be formed in the dielectric layer 105.

With reference to FIG. 20, the hard mask opening 205O may be formed with a procedure similar to that illustrated in FIG. 8, and descriptions thereof are not repeated herein. A portion of the bottom filling layer 203 may be exposed through the hard mask opening 205O.

With reference to FIG. 21, a trench etching process may be performed using the top hard mask layer 205 and/or the third mask layer 405 as the mask to remove portions of the dielectric layer 105 and the bottom filling layer 203. In some embodiments, the etch rate ratio of the dielectric layer 105 to the top hard mask layer 205 may be between about 100:1 and about 1.05:1 or between about 100:1 and about 10:1 during the trench etching process. The etch rate ratio of the bottom filling layer 203 to the top hard mask layer 205 may be between about 100:1 and about 1.05:1 or between about 100:1 and about 10:1 during the trench etching process. After the trench etching process, the trench opening TO may be formed in the dielectric layer 105. It should be noted that, in the current stage, the etch stop layer 103 may be still covered by the remaining bottom filling layer 203 in the via opening VO.

Figure 22:
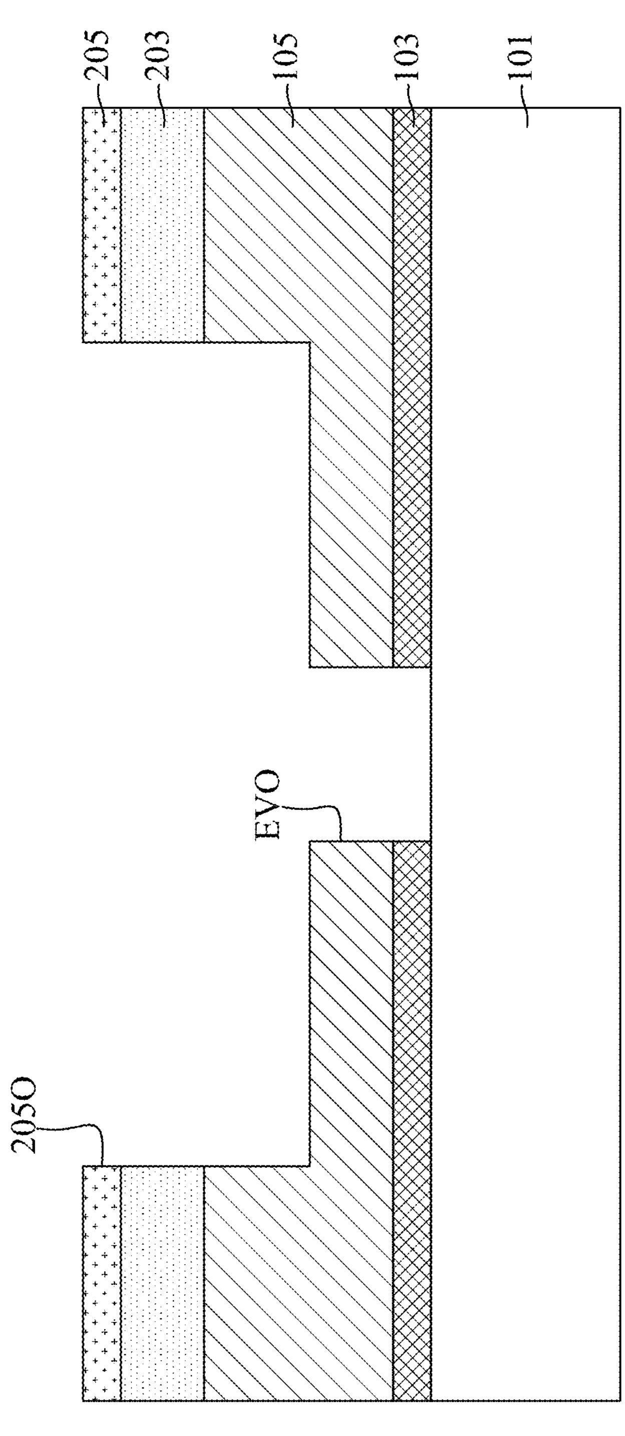

With reference to FIGS. 13 and 22, at step S43, a punch etching process may be performed to form an extended via opening EVO to expose the substrate 101.

With reference to FIG. 22, the punch etching process may remove the remaining bottom filling layer 203 in the via opening VO and the portion of the etch stop layer 103 exposed through the via opening VO. In some embodiments, the etch rate ratio of the bottom filling layer 203 to the dielectric layer 105 may be between about 100:1 and about 1.05:1 or between about 100:1 and about 10:1 during the punch etching process. In some embodiments, the etch rate ratio of the etch stop layer 103 to the substrate 101 may be between about 100:1 and about 1.05:1 or between about 100:1 and about 10:1 during the punch etching process. After the punch etching process, the via opening VO may be extended to the extended via opening EVO along the dielectric layer 105 and the etch stop layer 103. A portion of the substrate 101 may be exposed through the extended via opening EVO.

In some embodiments, the pre-cleaning treatment and the cleaning process with a procedure similar to that illustrated in FIG. 10 may be performed to the intermediate semiconductor device illustrated in FIG. 22, and descriptions thereof are not repeated herein.

Figure 23:
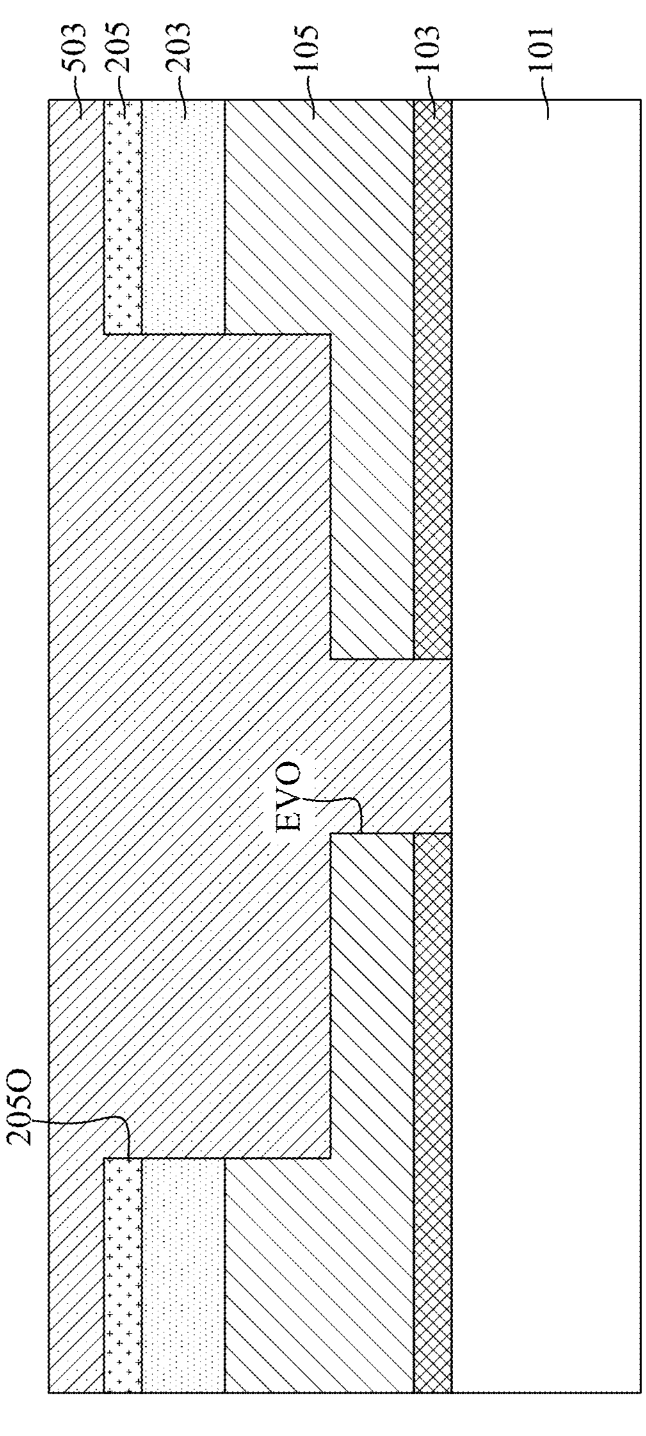
Figure 24:
Figure 24:
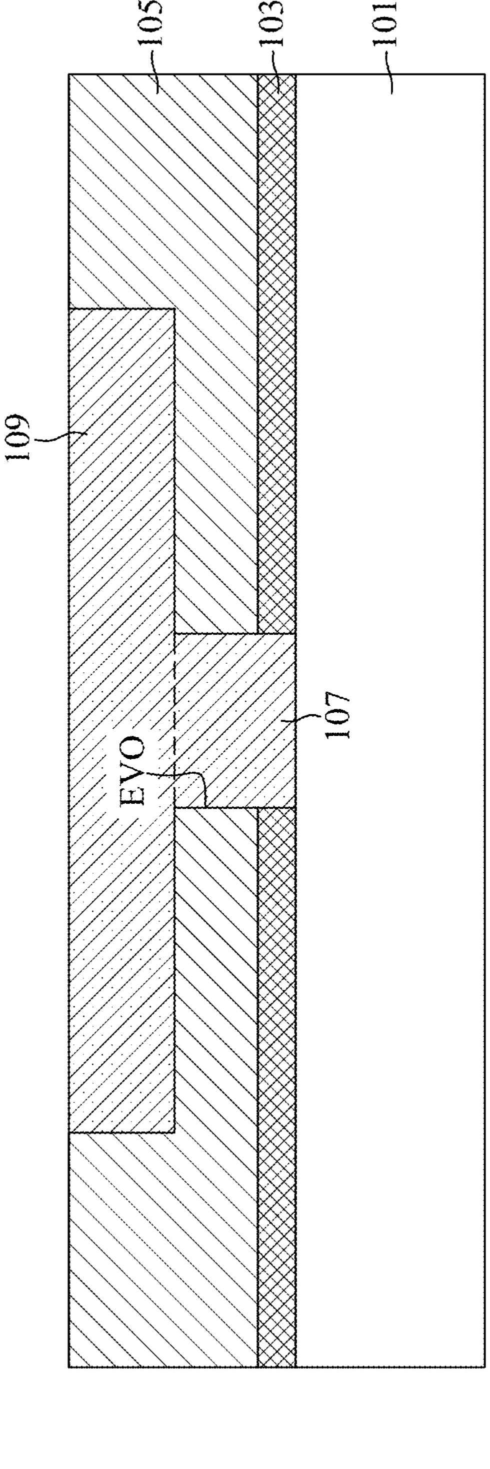

With reference to FIGS. 13, 23, and 24, at step S45, a via 107 may be formed in the extended via opening EVO, and a trench 109 may be formed in the trench opening TO.

With reference to FIGS. 23 and 24, the via 107 and the trench 109 may be formed with a procedure similar to that illustrated in FIGS. 11 and 12, and descriptions thereof are not repeated herein. The substrate 101, the first etch stop layer 103, the dielectric layer 105, the via 107, and the trench 109 together configure the semiconductor device 1B.

One aspect of the present disclosure provides a method for fabricating a semiconductor device including providing a substrate; forming a dielectric layer on the substrate; forming a via opening in the dielectric layer using a first mask layer as a mask; forming a failed hard mask layer to fill the via opening; forming a second mask layer on the failed hard mask layer; removing the second mask layer and the failed hard mask layer; forming an underfill layer to fill the via opening; forming a top hard mask layer on the underfill layer; forming a third mask layer on the top hard mask layer; patterning the top hard mask layer using the third mask layer as a mask; forming a trench opening in the dielectric layer using the top hard mask layer as a mask; and forming a via in the via opening and forming a trench in the trench opening.

Another aspect of the present disclosure provides a method for fabricating a semiconductor device including providing a substrate; forming a dielectric layer on the substrate; forming a via opening in the dielectric layer using a first mask layer as a mask; forming a failed hard mask layer to fill the via opening; forming a second mask layer on the failed hard mask layer; removing the second mask layer; performing a reapplying process to turn the failed hard mask layer into a bottom filling layer; forming a top hard mask layer on the bottom filling layer; forming a third mask layer on the top hard mask layer; patterning the top hard mask layer using the third mask layer as a mask; forming a trench opening in the dielectric layer using the top hard mask layer as a mask; and forming a via in the via opening and forming a trench in the trench opening.

Another aspect of the present disclosure provides a reworking method of a failed hard mask layer on a via opening in a dielectric layer, including removing the failed hard mask layer; forming an underfill layer to fill the via opening; forming a top hard mask layer on the underfill layer; and forming a mask layer on the top hard mask layer.

Another aspect of the present disclosure provides a reworking method of a failed hard mask layer on a via opening in a dielectric layer, including performing a reapplying process to turn the failed hard mask layer into a bottom filling layer; forming a top hard mask layer on the bottom filling layer; and forming a mask layer on the top hard mask layer.

Due to the design of the method of fabricating of the semiconductor device of the present disclosure, the enlargement of the via opening VO and/or the damage to the profile of the via opening VO may be alleviated or avoided by employing the underfill layer 201 or the bottom filling layer 203. As a result, the yield and/or the reliability of the semiconductor devices 1A, 1B may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:

providing a substrate;

forming a dielectric layer on the substrate;

forming a via opening in the dielectric layer using a first mask layer as a mask;

forming a failed hard mask layer to fill the via opening;

forming a second mask layer on the failed hard mask layer;

removing the second mask layer and the failed hard mask layer;

forming an underfill layer to fill the via opening;

forming a top hard mask layer on the underfill layer;

forming a third mask layer on the top hard mask layer;

patterning the top hard mask layer using the third mask layer as a mask;

forming a trench opening in the dielectric layer using the top hard mask layer as a mask; and forming a via in the via opening and forming a trench in the trench opening;

wherein a thickness of the failed hard mask layer and a thickness of the underfill layer are different;

wherein the dielectric layer comprises a low-k material.

2. The method for fabricating the semiconductor device of claim 1, wherein the thickness of the failed hard mask layer is between about 30 nm and about 50 nm.

3. The method for fabricating the semiconductor device of claim 1, wherein the underfill layer and the failed hard mask layer comprise different materials.

4. The method for fabricating the semiconductor device of claim 3, wherein the thickness of the underfill layer is between about 180 nm and about 220 nm.

5. The method for fabricating the semiconductor device of claim 4, wherein the top hard mask layer comprises boron nitride, silicon boron nitride, phosphorus boron nitride, or boron carbon silicon nitride.

6. The method for fabricating the semiconductor device of claim 5, wherein the underfill layer comprises a carbon film.

7. The method for fabricating the semiconductor device of claim 6, wherein the via and the trench comprise copper.

8. The method for fabricating the semiconductor device of claim 7, further comprising forming an etch stop layer between the substrate and the dielectric layer.

9. A method for fabricating a semiconductor device, comprising:

providing a substrate;

forming a dielectric layer on the substrate;

forming a via opening in the dielectric layer using a first mask layer as a mask;

forming a failed hard mask layer to fill the via opening;

forming a second mask layer on the failed hard mask layer;

removing the second mask layer;

performing a reapplying process to turn the failed hard mask layer into a bottom filling layer;

forming a top hard mask layer on the bottom filling layer;

forming a third mask layer on the top hard mask layer;

patterning the top hard mask layer using the third mask layer as a mask;

forming a trench opening in the dielectric layer using the top hard mask layer as a mask; and forming a via in the via opening and forming a trench in the trench opening;

wherein a thickness of the failed hard mask layer and a thickness of the bottom filling layer are different;

wherein the dielectric layer comprises a low-k material.

10. The method for fabricating the semiconductor device of claim 9, wherein the bottom filling layer and the failed hard mask layer comprise the same material.

11. The method for fabricating the semiconductor device of claim 10, wherein the thickness of the failed hard mask layer is between about 30 nm and about 50 nm.

12. The method for fabricating the semiconductor device of claim 11, wherein the thickness of the bottom filling layer is between about 180 nm and about 220 nm.

13. The method for fabricating the semiconductor device of claim 12, wherein the top hard mask layer comprises boron nitride, silicon boron nitride, phosphorus boron nitride, or boron carbon silicon nitride.

14. The method for fabricating the semiconductor device of claim 13, further comprising forming an etch stop layer between the substrate and the dielectric layer.

15. The method for fabricating the semiconductor device of claim 14, wherein the etch stop layer comprises silicon carbonitride or silicon oxycarbide.

16. The method for fabricating the semiconductor device of claim 15, wherein the via and the trench comprise copper.

* * * * *